(12) United States Patent
Toba

(10) Patent No.: US 8,426,037 B2
(45) Date of Patent: *Apr. 23, 2013

(54) TRIAZINE RING-CONTAINING POLYMER COMPOUND AND ORGANIC LIGHT-EMITTING ELEMENT USING THE POLYMER COMPOUND

(75) Inventor: Masahiko Toba, Chiba (JP)

(73) Assignee: Showa Denko K.K., Tokyo (JP)

( * ) Notice: Subject to any disclaimer, the term of this patent is extended or adjusted under 35 U.S.C. 154(b) by 511 days.

This patent is subject to a terminal disclaimer.

(21) Appl. No.: 12/668,799

(22) PCT Filed: Jul. 10, 2008

(86) PCT No.: PCT/JP2008/062445
§ 371 (c)(1),
(2), (4) Date: Jan. 12, 2010

(87) PCT Pub. No.: WO2009/011270
PCT Pub. Date: Jan. 22, 2009

(65) Prior Publication Data
US 2010/0201257 A1 Aug. 12, 2010

(30) Foreign Application Priority Data

Jul. 13, 2007 (JP) ................................. 2007-184403

(51) Int. Cl.
*H01L 51/54* (2006.01)
*C08F 226/06* (2006.01)

(52) U.S. Cl.
USPC ........... 428/690; 428/917; 313/504; 313/506; 526/261

(58) Field of Classification Search ........................ None
See application file for complete search history.

(56) References Cited

U.S. PATENT DOCUMENTS 5,538,840 A 7/1996 Van Toan et al.
5,672,704 A 9/1997 Toan et al.
(Continued)

FOREIGN PATENT DOCUMENTS

CN 1130625 A 9/1996
(Continued)

OTHER PUBLICATIONS

Machine-generated translation for JP 2007-106793, which has a publication date of Apr. 2007.*

(Continued)

*Primary Examiner* — Dawn L. Garrett
(74) *Attorney, Agent, or Firm* — Sughrue Mion, PLLC

(57) ABSTRACT

The polymer compound of the present invention is characterized by comprising a constitutional unit derived from a compound represented by the formula (1):

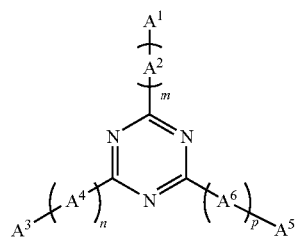

(1)

wherein $A^1$, $A^3$ and $A^5$ are each independently a monovalent aromatic group which may have a hetero atom as a ring-constituting atom, $A^2$, $A^4$ and $A^6$ are each independently a divalent aromatic group which may have a hetero atom as a ring-constituting atom, at least one of $A^1$ to $A^6$ has a substituent having a polymerizable functional group, $A^1$ to $A^6$ may have a substituent other than a substituent having a polymerizable functional group, m is an integer of 1 to 2, n is an integer of 0 to 2, and p is an integer of 0 to 2.

7 Claims, 1 Drawing Sheet

U.S. PATENT DOCUMENTS

| | | | |
|---|---|---|---|
| 5,686,233 A | | 11/1997 | Valet et al. |
| 5,869,588 A | | 2/1999 | Toan et al. |
| 6,057,048 A | * | 5/2000 | Hu et al. .................. 428/690 |
| 6,229,012 B1 | * | 5/2001 | Hu et al. .................. 544/180 |
| 6,670,772 B1 | * | 12/2003 | Arnold et al. ............ 315/169.3 |
| 7,368,181 B2 | | 5/2008 | Lee et al. |
| 2002/0055014 A1 | * | 5/2002 | Okada et al. ............... 428/690 |
| 2003/0091862 A1 | * | 5/2003 | Tokito et al. ............... 428/690 |
| 2003/0170490 A1 | | 9/2003 | Hu et al. |
| 2003/0236327 A1 | * | 12/2003 | Leppard et al. ............. 524/100 |
| 2006/0127697 A1 | | 6/2006 | Lee et al. |
| 2006/0229407 A1 | * | 10/2006 | Vogel et al. ................ 524/561 |
| 2007/0015007 A1 | | 1/2007 | Shin et al. |
| 2010/0201258 A1 | * | 8/2010 | Toba ......................... 313/504 |
| 2010/0327738 A1 | * | 12/2010 | Toba et al. ................. 313/504 |

FOREIGN PATENT DOCUMENTS

| | | |
|---|---|---|
| EP | 1424350 A1 | 6/2004 |
| JP | 8-157575 A | 6/1996 |
| JP | 10-1665 A | 1/1998 |
| JP | 2002-129155 A | 5/2002 |
| JP | 2002-193952 A | 7/2002 |
| JP | 2004-185967 A | 7/2004 |
| JP | 2006-173569 A | 6/2006 |
| JP | 2006-225428 A | 8/2006 |
| JP | 2007-106793 A | 4/2007 |
| JP | 2007-169475 A | 7/2007 |
| JP | 2007-169541 A | 7/2007 |
| JP | 2007-169565 A | 7/2007 |

OTHER PUBLICATIONS

Machine translation for JP 2004-185967, which was published Jul. 2004.*

Machine translation for JP 2007-169541, which was published Jul. 2007.*

Marc Behl, et al., "Block Copolymers Build-up of Electron and Hole Transport Materials", Macromolecular Chemistry and Physics, 2004, pp. 1633-1643, 205.

Se Young Oh, "Characteristics of Polymer Light Emitting Diode Using a Phosphorescent Terpolymer Containing Perylene, Triazine and Ir (ppy)3 Moieties in the Polymer Side Chain", Mol. Cryst. Liq. Cryst., 2006, pp. 227-235, vol. 458.

Toshihide Yamamoto et al.; "Palladium-Catalyzed Synthesis of Triarylamines from Aryl Halides and Diarylamines"; Tetrahedron Letters; vol. 39; 1998; pp. 2367-2370.

* cited by examiner

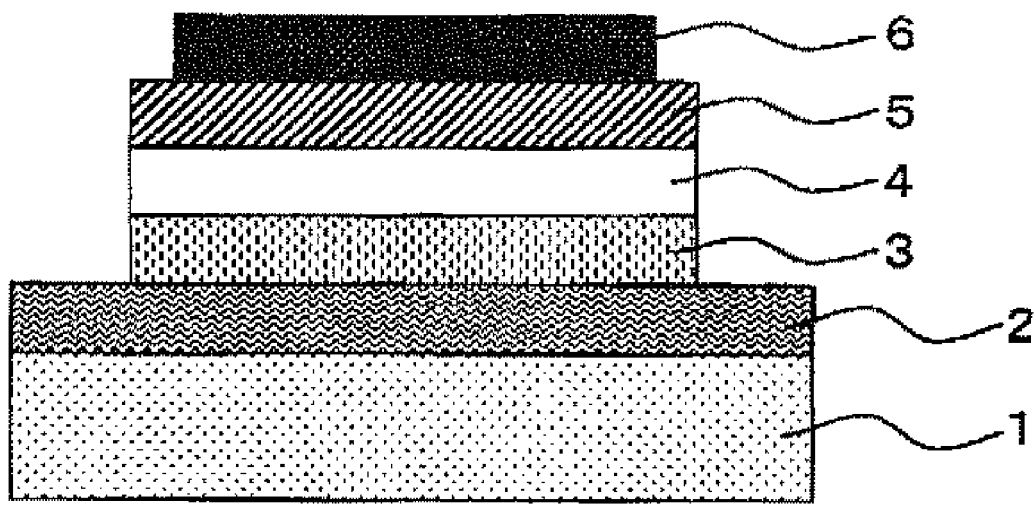

US 8,426,037 B2

TRIAZINE RING-CONTAINING POLYMER COMPOUND AND ORGANIC LIGHT-EMITTING ELEMENT USING THE POLYMER COMPOUND

TECHNICAL FIELD

The present invention relates to a triazine ring-containing polymer compound. More particularly, the invention relates to an electron transport triazine ring-containing polymer compound preferably used for an organic light-emitting element.

BACKGROUND ART

As an organic light-emitting element, an element having a multi-layer structure wherein one or plural organic layers are provided between an anode and a cathode is known. In a patent document 1, an organic light-emitting element containing a triazine derivative that is a low-molecular compound in an organic layer is disclosed.

When a layer is formed using a low-molecular compound, a vacuum deposition method is generally used. In this method, however, there is a problem such that vacuum equipment is necessary or the film thickness of the layer is liable to become ununiform.

In contrast with this, use of a polymer compound has an advantage that the layer can be formed by a coating method such as spin coating. For example, in a patent document 2, a fluorescent conjugated polymer compound comprising a repeating unit containing a triazine ring is disclosed.

In a non-patent document 1, a non-conjugated polymer compound having a triazine skeleton, which can be utilized for organic light-emitting elements or field effect transistors, is disclosed. This polymer compound is specifically a polymer compound obtained by copolymerizing an electron transport triphenyltriazine derivative monomer and a hole transport triphenylamine derivative monomer.

In a non-patent document 2, a non-conjugated polymer compound comprising a constitutional unit derived from a triphenyltriazine derivative, a constitutional unit derived from a perylene derivative and a constitutional unit derived from an iridium complex, and an organic light-emitting element using the polymer compound are disclosed.

Patent document 1: Japanese Patent Laid-Open Publication No. 173569/2006
Patent document 2: Japanese Patent Laid-Open Publication No. 129155/2002
Non-patent document 1: Marc Behl et al., "Block Copolymers Build-up of Electron and Hole transport Materials", Macromolecular Chemistry and Physics, 2004, 205, pp. 1633-1643
Non-patent document 2: Se Young Oh et al., "Characteristics of Polymer Light Emitting Diode Using a Phosphorescent Terpolymer Containing Perylene, Triazine and Ir(ppy) 3 Moieties in the Polymer Side Chain", Molecular Crystals and Liquid Crystals, 2006, 458, pp. 227-235.

DISCLOSURE OF THE INVENTION

Problem to be Solved by the Invention

In the organic light-emitting element using a polymer compound described in the non-patent document 2, however, there is yet room for improvement in respects of driving voltage, luminous efficiency and maximum attainable brightness.

Accordingly, it is an object of the present invention to provide a polymer compound which has a low driving voltage and by which high luminous efficiency and high luminance are obtained when it is used for an organic light-emitting element.

Means to Solve the Problem

In order to solve the above problems, the present inventors have earnestly studied. As a result, they have found that a polymer compound which can give an organic light-emitting element having a low driving voltage and having high luminous efficiency and high luminance is obtained because the polymer compound contains a constitutional unit derived from a specific polymerizable compound, and they have accomplished the present invention.

That is to say, the present invention relates to, for example, the following matters [1] to [9].

[1] A polymer compound containing a constitutional unit derived from an electron transport polymerizable compound represented by the formula (1):

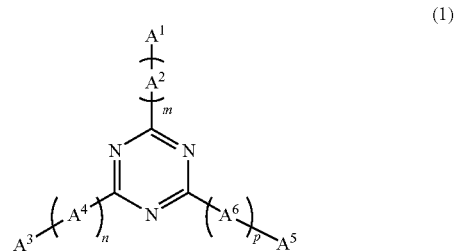

wherein $A^1$, $A^3$ and $A^5$ are each independently a monovalent aromatic group which may have a hetero atom as a ring-constituting atom, $A^2$, $A^4$ and $A^6$ are each independently a divalent aromatic group which may have a hetero atom as a ring-constituting atom, at least one of $A^1$ to $A^6$ has a substituent having a polymerizable functional group, $A^1$ to $A^6$ may have a substituent other than a substituent having a polymerizable functional group, m is an integer of 1 to 2, n is an integer of 0 to 2, and p is an integer of 0 to 2.

[2] The polymer compound as stated in the above [1], wherein $A^1$ has a substituent having a polymerizable group, and both n and p do not represent 0 at the same time.

[3] The polymer compound as stated in the above [1] or [2], which is a light-emitting polymer compound further having a constitutional unit derived from a light-emitting polymerizable compound.

[4] The polymer compound as stated in the above [3], wherein the light-emitting polymerizable compound has phosphorescent property.

[5] The polymer compound as stated in the above [4], wherein the light-emitting polymerizable compound is a transition metal complex containing a substituent having a polymerizable functional group.

[6] The polymer compound as stated in the above [5], wherein the transition metal complex is an iridium complex.

[7] The polymer compound as stated in any one of the above [1] to [6], which further contains a unit derived from a hole transport polymerizable compound.

[8] An organic light-emitting element constituted by arranging a light-emitting layer between an anode and a cathode, wherein the light-emitting layer contains the polymer compound as stated in any one of the above [1] to [7].

Effect of the Invention

According to the polymer compound of the present invention, an organic light-emitting element having not only a low driving voltage but also high luminous efficiency and high luminance is obtained.

BRIEF DESCRIPTION OF THE DRAWING

FIG. 1 is a sectional view of an example of the organic light-emitting element according to the present invention.

| Description of numerical symbols | |
|---|---|
| 1: | glass substrate |
| 2: | anode |
| 3: | hole transport layer |
| 4: | light-emitting layer |
| 5: | electron transport layer |
| 6: | cathode |

BEST MODE FOR CARRYING OUT THE INVENTION

The present invention is described in detail hereinafter. In the present specification, the "electron transport property" and the "hole transport property" are together referred to also as "carrier transport property".

Embodiment 1

The polymer compound (1) (embodiment 1) of the invention contains a constitutional unit derived from an electron transport polymerizable compound represented by the aforesaid formula (1), and is obtained by polymerizing an electron transport polymerizable compound represented by the formula (1). In the electron transport moiety of the polymer compound, a structure wherein a triazine ring, a divalent aromatic group ($A^2$) and a monovalent aromatic group ($A^1$) are aligned in series is contained, and hence, an organic light-emitting element having high luminous efficiency is obtained.

In the aforesaid formula (1), $A^1$, $A^3$ and $A^5$ are each independently a monovalent aromatic group which may have a hetero atom as a ring-constituting atom, e.g., a monovalent aromatic group of a 5-membered ring or a 6-membered ring (which may have a hetero atom as a ring-constituting atom) or a monovalent condensed polycyclic aromatic group (which may have a hetero atom as a ring-constituting atom).

Of these, the aromatic group of a 6-membered ring is preferable, and as the aromatic group, a phenyl group, a pyridyl group or a pyrimidyl group can be mentioned.

Of these, a phenyl group is preferable from the viewpoint of carrier transport ability.

$A^2$, $A^4$ and $A^6$ are each independently a divalent aromatic group which may have a hetero atom as a ring-constituting atom, e.g., a divalent aromatic group of a 5-membered ring or a 6-membered ring (which may have a hetero atom as a ring-constituting atom) or a divalent condensed polycyclic aromatic group (which may have a hetero atom as a ring-constituting atom).

Of these, the aromatic group of a 6-membered ring is preferable, and as the aromatic group, a phenylene group, a pyridylene group or a pyrimidylene group can be mentioned.

Of these, a phenylene group is preferable from the viewpoint of carrier transport ability.

At least one of $A^1$ to $A^6$ has a substituent having a polymerizable functional group. When $A^1$ of them has a substituent having a polymerizable functional group, an organic light-emitting element having higher luminous efficiency is obtained.

The above polymerizable functional group may be any of radical polymerizable, cationic polymerizable, anionic polymerizable, addition polymerizable and condensation polymerizable functional groups. Of these, the radical polymerizable functional group is preferable because preparation of a polymer is easy.

As the substituent having a polymerizable functional group, specifically, a substituent represented by the following formula (7) is preferable.

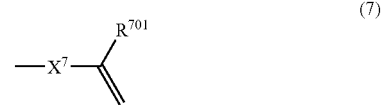

(7)

In the formula (7), $R^{701}$ is a hydrogen atom or an alkyl group of 1 to 12 carbon atoms.

Examples of the alkyl groups of 1 to 12 carbon atoms include methyl group, ethyl group, propyl group, isopropyl group, butyl group, isobutyl group, t-butyl group, amyl group, hexyl group, octyl group, decyl group, 2-ethylhexyl group and dodecyl group.

Of these, a hydrogen atom is preferable as $R^{701}$ from the viewpoint of carrier transport ability.

$X^7$ is a single bond or a group represented by any one of the following formulas (X71) to (X74).

 (X71)

 (X72)

 (X73)

 (X74)

In the above formulas, $R^{X71}$ is a single bond or an alkylene group of 1 to 12 carbon atoms, and $R^{X72}$ is a single bond, an alkylene group of 1 to 12 carbon atoms or a phenylene group. In the formula (1), it is preferable that $R^{X71}$ is bonded to $A^1$ and $RX^{72}$ is bonded to a vinyl group. According to such $X^7$, an organic light-emitting element having not only a low driving voltage but also high luminous efficiency and high luminance is obtained.

Of these, a single bond or an alkylene group of 1 to 20 carbon atoms is preferable as $X^7$, and a single bond is more preferable. When no hetero atom is contained in $X^7$ as above, an organic light-emitting element having higher luminous efficiency is obtained.

$A^1$ to $A^6$ may have a substituent other than a substituent having a polymerizable functional group.

As such a substituent, a cyano group, an amino group, an alkyl group of 1 to 12 carbon atoms or an alkoxy group of 1 to 12 carbon atoms can be mentioned.

Examples of the alkyl groups of 1 to 12 carbon atoms include methyl group, ethyl group, propyl group, isopropyl group, butyl group, isobutyl group, t-butyl group, amyl group, hexyl group, octyl group, decyl group, 2-ethylhexyl group and dodecyl group.

Examples of the alkoxy groups of 1 to 12 carbon atoms include methoxy group, ethoxy group, propoxy group, isopropoxy group, butoxy group, isobutoxy group, t-butoxy group, hexyloxy group, 2-ethylhexyloxy group, decyloxy group and dodecyloxy group.

In the electron transport polymerizable compound, it is particularly preferable from the viewpoints of solubility and carrier transport ability that $A^1$ is represented by the following formula (12), $A^3$ and $A^5$ are each represented by the following formula (13), and $A^2$, $A^4$ and $A^6$ are each represented by the following formula (14). In the following formula, $IR^{1301}$ is a hydrogen atom, an alkyl group of 1 to 12 carbon atoms or an alkoxy group of 1 to 12 carbon atoms, and is preferably an alkyl group of 1 to 12 carbon atoms.

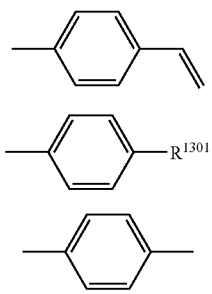

m is an integer of 1 to 2. n is an integer of 0 to 2, and p is an integer of 0 to 2. From the viewpoint of symmetry of molecule, it is preferable that both n and p do not represent 0 at the same time.

The above electron transport polymerizable compounds may be used singly or may be used in combination of two or more kinds.

Such an electron transport polymerizable compound can be prepared by, for example, subjecting a benzonitrile derivative and bromobenzoyl chloride to cyclization reaction using Lewis acid and then coupling vinylphenylboric acid by Suzuki coupling method.

In the preparation of the polymer compound (1), other polymerizable compounds maybe further used. Examples of the other polymerizable compounds include compounds having no carrier transport property, specifically, alkyl(meth) acrylates, such as methyl acrylate and methyl methacrylate, styrene and derivatives thereof, but the other polymerizable compounds are not limited to these compounds. In the polymer compound (1), the content of structural units derived from other polymerizable compounds is preferably in the range of 0 to 50% by mol.

Although the preparation of the polymer compound (1) may be carried out by any of radical polymerization, cationic polymerization, anionic polymerization and addition polymerization using the aforesaid polymerizable compounds, it is preferable to carry out the preparation by radical polymerization.

The weight-average molecular weight of the polymer compound (1) is desired to be in the range of usually 1,000 to 2,000,000, preferably 5,000 to 500,000. When the weight-average molecular weight is in this range, the polymer compound (1) is soluble inorganic solvents and a uniform thin film is obtained, so that such a weight-average molecular weight is preferable. The weight-average molecular weight is a value measured by gel permeation chromatography (GPC) at 40° C. using tetrahydrofuran as a solvent.

With regard to the solubility of the polymer compound (1) in organic solvents such as toluene and chloroform, it is preferable that 1 part by weight of the polymer compound (1) is dissolved in 1 to 200 parts by weight of an organic solvent, and it is more preferable that 1 part by weight of the polymer compound (1) is dissolved in 10 to 50 parts by weight of an organic solvent. When the solubility is in this range, preparation of an organic light-emitting element by a coating method is easily carried out, so that such solubility is preferable.

Embodiment 2

The polymer compound (2) (embodiment 2) of the invention further contains a constitutional unit derived from a light-emitting polymerizable compound together with a constitutional unit derived from an electron transport polymerizable compound represented by the aforesaid formula (1), and is obtained by polymerizing the electron transport polymerizable compound represented by the formula (1) and a light-emitting polymerizable compound.

The electron transport polymerizable compound represented by the formula (1) has the same meaning as that of the electron transport polymerizable compound for use in the embodiment 1, and a preferred range and the reason are the same as those in the embodiment (1).

The light-emitting polymerizable compound preferably has phosphorescent property, is more preferably a transition metal complex containing a substituent having a polymerizable functional group, and is still more preferably an iridium complex containing a substituent having a polymerizable functional group.

As such iridium complexes, complexes represented by the following formulas (2) to (4) are preferably used. These polymerizable compounds have a vinyl group that is a polymerizable functional group.

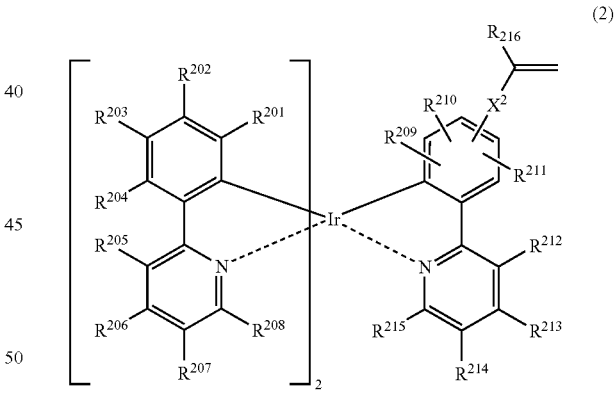

In the formula (2), $R^{201}$ to $R^{215}$ are each independently an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted by an alkyl group of 1 to 10 carbon atoms, an alkoxy group of 1 to 10 carbon atoms and a silyl group.

As the halogen atom, a fluorine atom, a chlorine atom, a bromine atom or an iodine atom can be mentioned.

Examples of the alkyl groups of 1 to 10 carbon atoms include methyl group, ethyl group, propyl group, isopropyl group, butyl group, isobutyl group, t-butyl group, amyl group, hexyl group, octyl group and decyl group.

Examples of the aryl groups of 6 to 10 carbon atoms include phenyl group, tolyl group, xylyl group, mesityl group and naphthyl group.

Examples of the amino groups which may be substituted by an alkyl group of 1 to 10 carbon atoms include amino group, dimethylamino group, diethylamino group and dibutylamino group.

Examples of the alkoxy groups of 1 to 10 carbon atoms include methoxy group, ethoxy group, propoxy group, isopropoxy group, butoxy group, isobutoxy group, t-butoxy group, hexyloxy group, 2-ethylhexyloxy group and decyloxy group.

Examples of the silyl groups include trimethylsilyl group, triethylsilyl group, t-butyldimethylsilyl group and trimethoxysilyl group.

From the viewpoint of phosphorescent property, it is preferable that $R^{201}$ to $R^{215}$ are each a hydrogen atom, a fluorine atom, a cyano group, a methyl group, a t-butyl group, a dimethylamino group, a butoxy group or a 2-ethylhexyloxy group, and it is more preferable that $R^{202}$ is a t-butyl group and $R^{201}$ to $R^{215}$ except $R^{202}$ are each a hydrogen atom.

In each of $R^{201}$ to $R^{204}$, $R^{205}$ to $R^{208}$, $R^{209}$ to $R^{211}$, and $R^{212}$ to $R^{215}$, two groups bonded to carbon atoms adjacent to each other on a ring may be bonded to each other to form a condensed ring.

$R^{216}$ is a hydrogen atom or an alkyl group of 1 to 12 carbon atoms. Examples of the aforesaid alkyl groups of 1 to 12 carbon atoms include the aforesaid alkyl groups.

Of these, a hydrogen atom is preferable as $R^{216}$ from the viewpoint of carrier transport ability.

$X^2$ is a single bond or a group represented by any one of the following formulas (X21) to (X24).

 (X21)

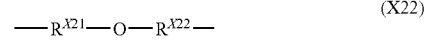 (X22)

 (X23)

 (X24)

In the above formulas, $R^{X21}$ is a single bond or an alkylene group of 1 to 12 carbon atoms, and $R^{X22}$ is a single bond, an alkylene group of 1 to 12 carbon atoms or a phenylene group. In the formula (2), it is preferable that $R^{X21}$ is bonded to a benzene ring and $R^{X22}$ is bonded to a vinyl group. When no hetero atom is contained in $X^2$, an organic light-emitting element having higher luminous efficiency is obtained.

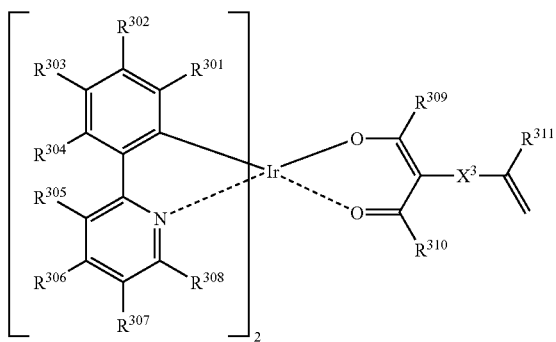
(3)

In the formula (3), $R^{301}$ to $R^{308}$ are each independently the same atom or substituent as that for $R^{201}$.

$R^{309}$ to $R^{310}$ are each independently the same atom or substituent as that for $R^{201}$ (except a halogen atom).

From the viewpoint of phosphorescent property, it is preferable that $R^{301}$ to $R^{310}$ are each independently a hydrogen atom, a fluorine atom, a cyano group, a methyl group, a t-butyl group, a dimethylamino group, a butoxy group or a 2-ethylhexyloxy group, and it is more preferable that $R^{302}$ is a t-butyl group and $R^{301}$ to $R^{310}$ except $R^{202}$ are each a hydrogen atom.

In each of $R^{301}$ to $R^{304}$, and $R^{305}$ to $R^{308}$, two groups bonded to carbon atoms adjacent to each other on a ring may be bonded to each other to form a condensed ring.

$R^{311}$ is the same atom or substituent as that for $R^{216}$, and a preferred range and the reason are the same as those for $R^{15}$.

$X^3$ is a single bond or a group represented by any one of the following formulas (X31) to (X34).

 (X31)

 (X32)

 (X33)

 (X34)

In the above formulas, $R^{X31}$ is a single bond or an alkylene group of 1 to 12 carbon atoms, and $R^{X32}$ is a single bond, an alkylene group of 1 to 12 carbon atoms or a phenylene group. A preferred range of $X^3$ and the reason are the same as those for $X^2$.

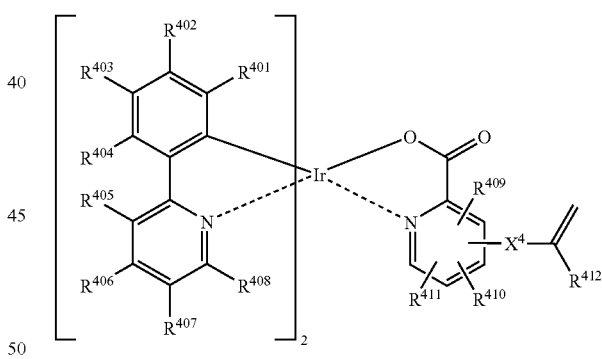
(4)

In the formula (4), $R^{401}$ to $R^{411}$ are each independently the same atom or substituent as that for $R^{201}$.

From the viewpoint of phosphorescent property, it is preferable that $R^{401}$ to $R^{411}$ are each independently a hydrogen atom, a fluorine atom, a cyano group, a methyl group, a t-butyl group, a dimethylamino group, a butoxy group or a 2-ethylhexyloxy group, and it is more preferable that $R^{402}$ is a t-butyl group and $R^{401}$ to $R^{411}$ except $R^{402}$ are each a hydrogen atom.

In each of $R^{401}$ to $R^{404}$, $R^{405}$ to $R^{408}$, and $R^{409}$ to $R^{411}$, two groups bonded to carbon atoms adjacent to each other on a ring may be bonded to each other to form a condensed ring.

$R^{412}$ is the same atom or substituent as that for $R^{216}$, and a preferred range and the reason are the same as those for $R^{216}$.

$X^4$ is a single bond or a group represented by any one of the following formulas (X41) to (X44).

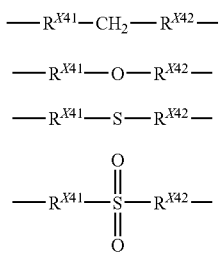

(X41) —R^{X41}—CH_2—R^{X42}—

(X42) —R^{X41}—O—R^{X42}—

(X43) —R^{X41}—S—R^{X42}—

(X44) —R^{X41}—S(=O)(=O)—R^{X42}—

In the above formulas, $R^{X41}$ is a single bond or an alkylene group of 1 to 12 carbon atoms, and $R^{X42}$ is a single bond, an alkylene group of 1 to 12 carbon atoms or a phenylene group. A preferred range of $X^4$ and the reason are the same as those for $X^2$.

The above phosphorescent polymerizable compounds may be used singly or may be used in combination of two or more kinds.

Such a phosphorescent polymerizable compound can be prepared by, for example, allowing iridium chloride and a phenylpyridine derivative to react with each other to form a binuclear complex of iridium and then allowing it to react with a ligand having a polymerizable functional group (ligand coordinated to the right-hand side of Ir in the formulas (2) to (4)).

Other polymerizable compounds which may be further used in the preparation of the polymer compound (2) are also the same as those in the embodiment (1).

Although the preparation of the polymer compound (2) may be carried out by any of radical polymerization, cationic polymerization, anionic polymerization and addition polymerization using the aforesaid polymerizable compounds, it is preferable to carry out the preparation by radical polymerization.

The weight-average molecular weight of the polymer compound (2) is the same as that in the embodiment (1). The solubility of the polymer compound (2) in organic solvents is the same as that in the embodiment (1).

When the number of constitutional units derived from the phosphorescent polymerizable compound is designated by m and the number of constitutional units derived from the electron transport polymerizable compound is designated by n (m and n are each an integer of not less than 1) in the polymer compound (2), the proportion of the number of constitutional units derived from the phosphorescent polymerizable compound to the number of all the constitutional units, namely a value of m/(m+n), is in the range of preferably 0.001 to 0.5, more preferably 0.001 to 0.2. When the value of m/(m+n) is in this range, an organic light-emitting element which has high carrier mobility, has low concentration quenching effect and has high luminous efficiency is obtained. The proportions of the constitutional units in such a polymer compound as above are estimated by ICP elemental analysis and $^{13}$C-NMR measurement.

If polymerization is carried out by properly controlling the ratio between the electron transport polymerizable compound and the phosphorescent polymerizable compound in the above range, a polymer compound (2) having a desired structure is obtained.

The polymer compound (2) may be any of a random copolymer, a block copolymer and an alternating copolymer.

Embodiment 3

The polymer compound (3) (embodiment 3) of the invention further contains a unit derived from a hole transport polymerizable compound together with a constitutional unit derived from an electron transport polymerizable compound represented by the aforesaid formula (1) and a constitutional unit derived from a light-emitting polymerizable compound, and is obtained by polymerizing the electron transport polymerizable compound represented by the formula (1), the light-emitting polymerizable compound and the hole transport polymerizable compound.

The electron transport polymerizable compound represented by the formula (1) and the light-emitting polymerizable compound have the same meanings as those of the electron transport polymerizable compound for use in the embodiment 1 and the light-emitting polymerizable compound for use in the embodiment 2, and preferred ranges and the reasons are the same as those in those embodiments.

As the hole transport polymerizable compound, a carbazole derivative or a triarylamine derivative, each containing a substituent having a polymerizable functional group, is preferably used.

Examples of such carbazole derivatives and triarylamine derivatives include

N,N'-diphenyl-N,N'(3-methylphenyl)-1,1'-biphenyl-4,4'-diamine (TPD),

N,N,N',N'-tetrakis(3-methylphenyl)-1,1'-(3,3'-dimethyl)biphenyl-4,4'-diamine (HMTPD), 4,4',4"-tris(3-methylphenylphenylamino)triphenylamine (m-MTDATA), 4,4'-biscarbazolylbiphenyl (CBP) and 4,4'-biscarbazolyl-2,2'-dimethylbiphenyl (CDBP) each of which contains a substituent having a polymerizable functional group.

The above hole transport polymerizable compounds may be used singly or may be used in combination of two or more kinds.

Hole transport polymerizable compounds represented by the following formulas (5) to (6) are also preferably used in the invention from the viewpoints of carrier transport ability and optical properties.

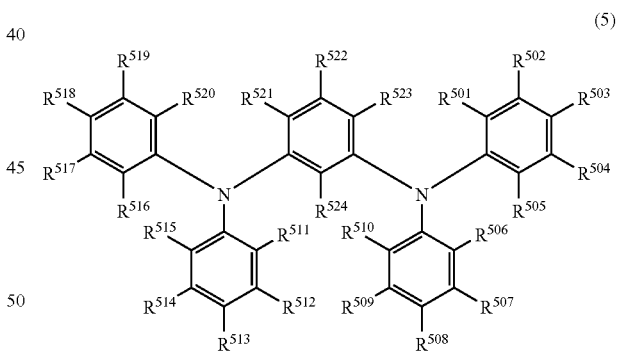

(5)

In the formula (5), at least one of $R^{501}$ to $R^{524}$ is a substituent having a polymerizable functional group, and $R^{501}$ to $R^{524}$ which are not the substituents having a polymerizable functional group are each independently an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted by an alkyl group of 1 to 10 carbon atoms, an alkoxy group of 1 to 10 carbon atoms, a carbazole group and a silyl group.

Examples of the above atoms and substituents include the aforesaid atoms and substituents. The carbazole group may have a substituent, such as methyl group, ethyl group, t-butyl group or methoxy group.

In each of $R^{501}$ to $R^{505}$, $R^{506}$ to $R^{510}$, $R^{511}$ to $R^{515}$, $R^{516}$ to $R^{520}$, and $R^{521}$ to $R^{523}$, two groups bonded to carbon atoms adjacent to each other on a benzene ring may be bonded to each other to form a condensed ring.

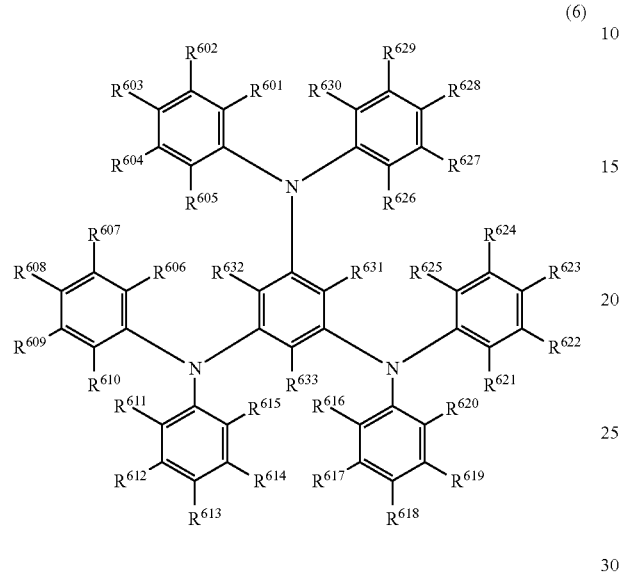

(6)

In the formula (6), at least one of $R^{601}$ to $R^{633}$ is a substituent having a polymerizable functional group, and $R^{601}$ to $R^{633}$ which are not the substituents having a polymerizable functional group are each independently an atom or a substituent selected from the group consisting of a hydrogen atom, a halogen atom, a cyano group, an alkyl group of 1 to 10 carbon atoms, an aryl group of 6 to 10 carbon atoms, an amino group which may be substituted by an alkyl group of 1 to 10 carbon atoms, an alkoxy group of 1 to 10 carbon atoms and a silyl group.

Examples of the above atoms and substituents include the aforesaid atoms and substituents.

In each of $R^{601}$ to $R^{605}$, $R^{606}$ to $R^{610}$, $R^{611}$ to $R^{615}$, $R^{616}$ to $R^{620}$, $R^{621}$ to $R^{625}$, and $R^{626}$ to $R^{630}$, two groups bonded to carbon atoms adjacent to each other on a benzene ring may be bonded to each other to form a condensed ring.

With regard to the polymerizable compound represented by the formula (5), at least one in each of $R^{501}$ to $R^{505}$, $R^{506}$ to $R^{510}$, $R^{511}$ to $R^{515}$, and $R^{516}$ to $R^{520}$ is preferably the above atom or the above substituent other than a hydrogen atom. In this case, $R^{501}$ to $R^{524}$ which are none of polymerizable functional groups, the above atoms and the above substituents are each a hydrogen atom. With regard to the polymerizable compound represented by the formula (6), at least one in each of $R^{601}$ to $R^{605}$, $R^{606}$ to $R^{610}$, $R^{611}$ to $R^{615}$, $R^{616}$ to $R^{620}$, $R^{621}$ to $R^{625}$, and $R^{626}$ to $R^{630}$ is preferably the above atom or the above substituent other than a hydrogen atom. In this case, $R^{601}$ to $R^{633}$ which are none of polymerizable functional groups, the above atoms and the above substituents are each a hydrogen atom.

As the substituent having a polymerizable functional group, a substituent represented by the aforesaid formula (7) is preferable.

$R^{701}$ is a hydrogen atom or an alkyl group of 1 to 12 carbon atoms. A preferred range of $R^{701}$ and the reason are the same as those in the electron transport polymerizable compound described in the embodiment 1.

$X^7$ is a single bond or a group represented by any one of the aforesaid formulas (X71) to (X74). A preferred range of $X^7$ and the reason are the same as those in the electron transport polymerizable compound described in the embodiment 1.

As the hole transport polymerizable compounds, there can be more specifically mentioned compounds represented by the following formulas (8-1) to (8-10).

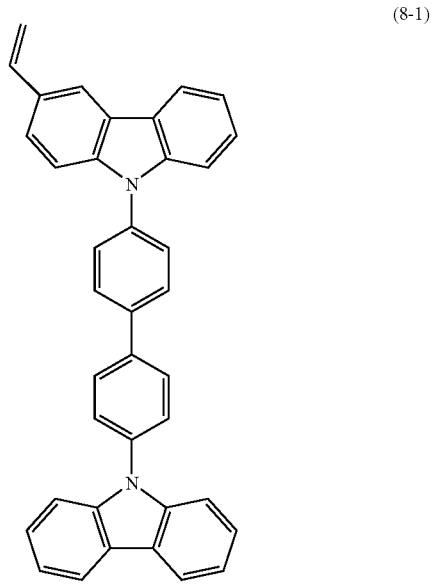

(8-1)

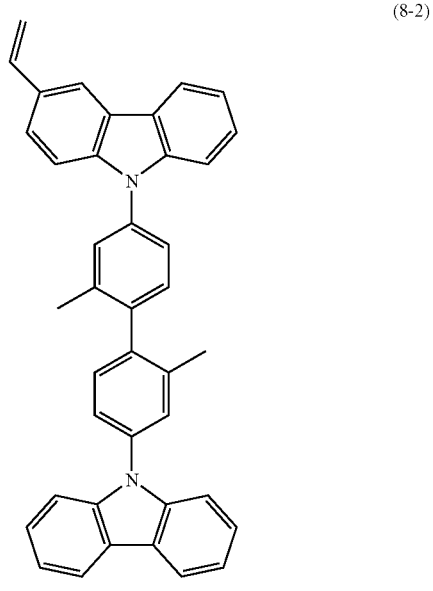

(8-2)

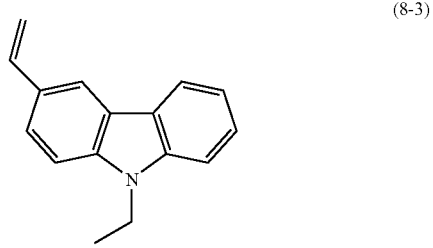

(8-3)

(8-4)
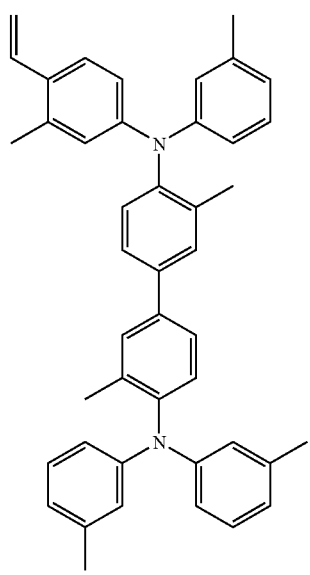
(8-7)
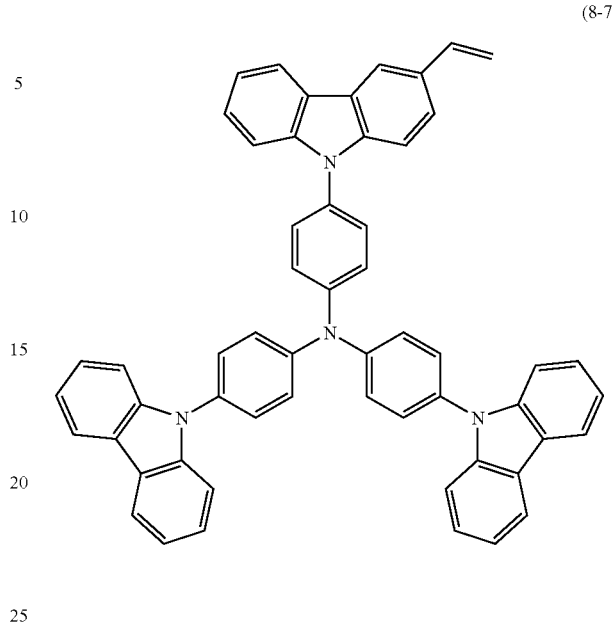
(8-5)
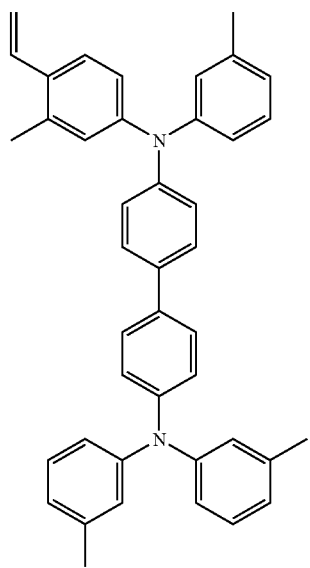
(8-8)
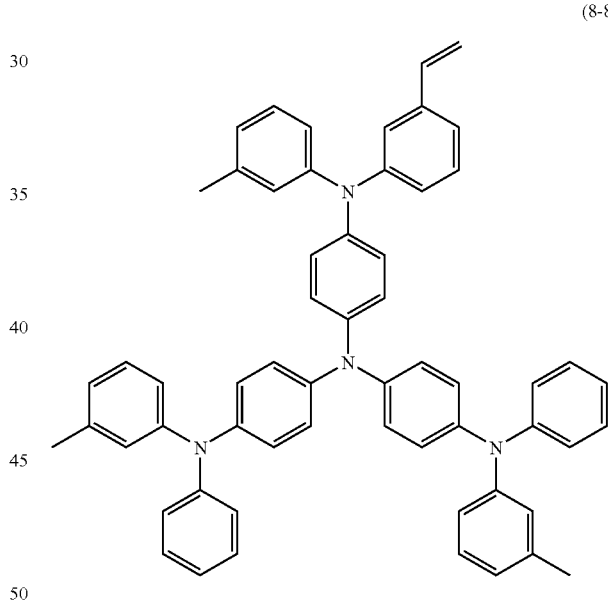
(8-6)
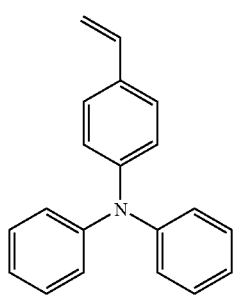
(8-9)
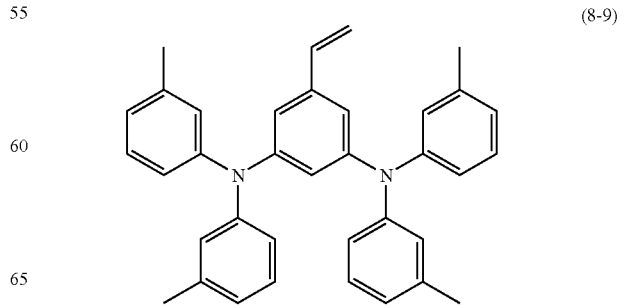

(8-10)

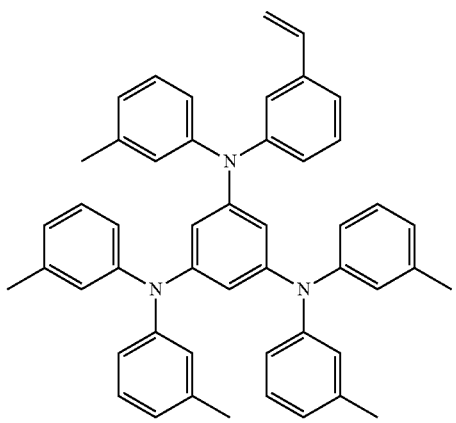

The above hole transport polymerizable compounds may be used singly or may be used in combination of two or more kinds.

The compound represented by the formula (5) can be prepared by, for example, palladium catalyst substitution reaction of a m-phenylenediamine derivative with halogenated aryl, or diarylamine with a m-dibromobenzene derivative. A specific method of the substitution reaction is described in, for example, *Tetrahedron Letters*, 1998, vol. 39, p. 2367. The compound represented by the formula (6) can be prepared by, for example, palladium catalyst substitution reaction of 1,3,5-triaminobenzene with halogenated aryl, or diarylamine with 1,3,5-trihalogenated benzene. A specific method of the substitution reaction is described in, for example, *Tetrahedron Letters*, 1998, vol. 39, p. 2367.

Other polymerizable compounds which may be further used in the preparation of the polymer compound (3) are also the same as those in the embodiment (1).

Although the preparation of the polymer compound (3) may be carried out by any of radical polymerization, cationic polymerization, anionic polymerization and addition polymerization using the aforesaid polymerizable compounds, it is preferable to carry out the preparation by radical polymerization.

The weight-average molecular weight of the polymer compound (3) is the same as that in the embodiment (1). The solubility of the polymer compound (3) in organic solvents is the same as that in the embodiment (1).

When the number of constitutional units derived from the phosphorescent polymerizable compound is designated by m and the number of constitutional units derived from the carrier transport polymerizable compound is designated by n (m and n are each an integer of not less than 1) in the polymer compound (3), the proportion of the number of constitutional units derived from the phosphorescent polymerizable compound to the number of all the constitutional units, namely a value of m/(m+n), is in the range of preferably 0.001 to 0.5, more preferably 0.001 to 0.2. When the value of m/(m+n) is in this range, an organic light-emitting element which has high carrier mobility, has low concentration quenching effect and has high luminous efficiency is obtained.

When the number of structural units derived from the hole transport polymerizable compound is designated by x and the number of structural units derived from the electron transport polymerizable compound is designated by y (x and y are each an integer of not less than 1) in the polymer compound (3), x, y and the above n have a relationship of n=x+y between them. Optimum values of the proportion of the number of structural units derived from the hole transport polymerizable compound to the number of structural units derived from the carrier transport compound, i.e., x/n, and the proportion of the number of structural units derived from the electron transport polymerizable compound to the number of structural units derived from the carrier transport compound, i.e., y/n, are determined by electric charge transport ability, concentration, etc. of the structural units. In the case where the light-emitting layer of the organic light-emitting element is formed from only the polymer compound (3), values of x/n and y/n are each in the range of preferably 0.05 to 0.95, more preferably 0.20 to 0.80. Then, an expression x/n+y/n=1 is established. The proportions of the constitutional units in such a polymer compound as above are estimated by ICP elemental analysis and $^{13}$C-NMR measurement.

If polymerization is carried out by properly controlling the ratio between the electron transport polymerizable compound, the phosphorescent polymerizable compound and the hole transport polymerizable compound in the above range, a polymer compound (3) having a desired structure is obtained.

The polymer compound (3) may be any of a random copolymer, a block copolymer and an alternating copolymer.

Embodiment 4

In the organic light-emitting element (embodiment 4) of the invention, one light-emitting layer containing the specific polymer compound (1), the later-described light-emitting compound and the later-described polymer compound (1') having a constitutional unit derived from a hole transport polymerizable compound is arranged between an anode and a cathode. In this case, the light-emitting layer desirably contains the light-emitting compound in an amount of preferably 0.1 to 50 parts by weight, more preferably 0.5 to 30 parts by weight, and the polymer compound (1') in an amount of preferably 10 to 200 parts by weight, more preferably 50 to 150 parts by weight, based on 100 parts by weight of the polymer compound (1). When the light-emitting layer is formed from the electron transport polymer compound (1), the light-emitting compound and the hole transport polymer compound (1') as above, an organic light-emitting element having high luminous efficiency can be prepared even if a layer of another organic material is not provided.

As the light-emitting compound, a phosphorescent compound is preferable, and an iridium complex is more preferable.

As such iridium complexes, specifically, the following complexes (E-1) to (E-39) are preferably used.

E-1

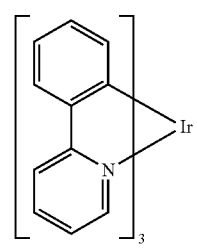

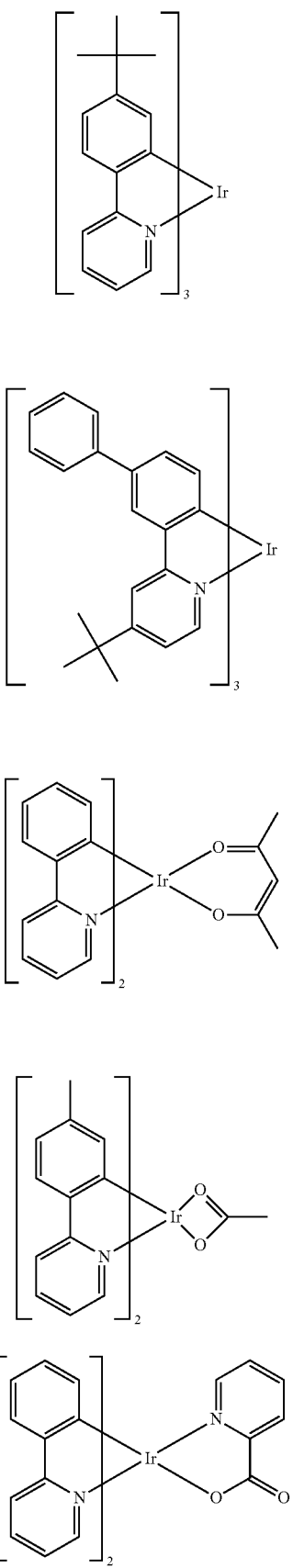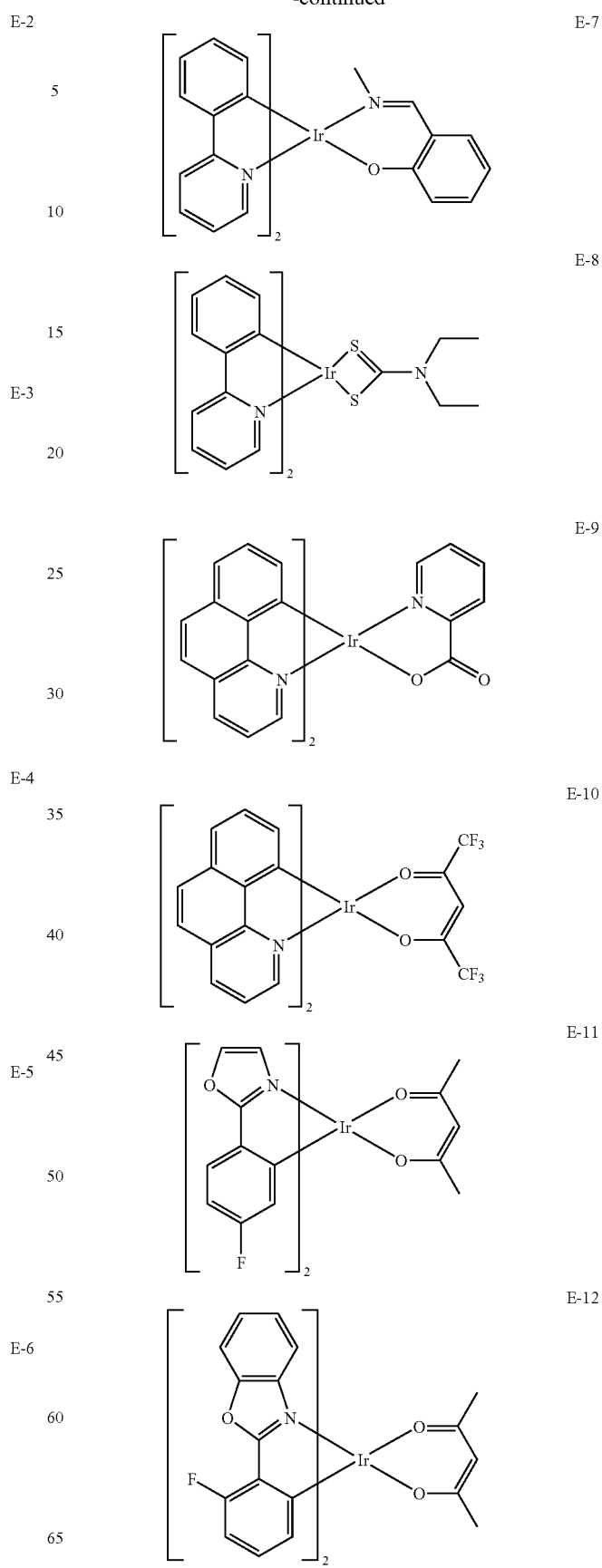

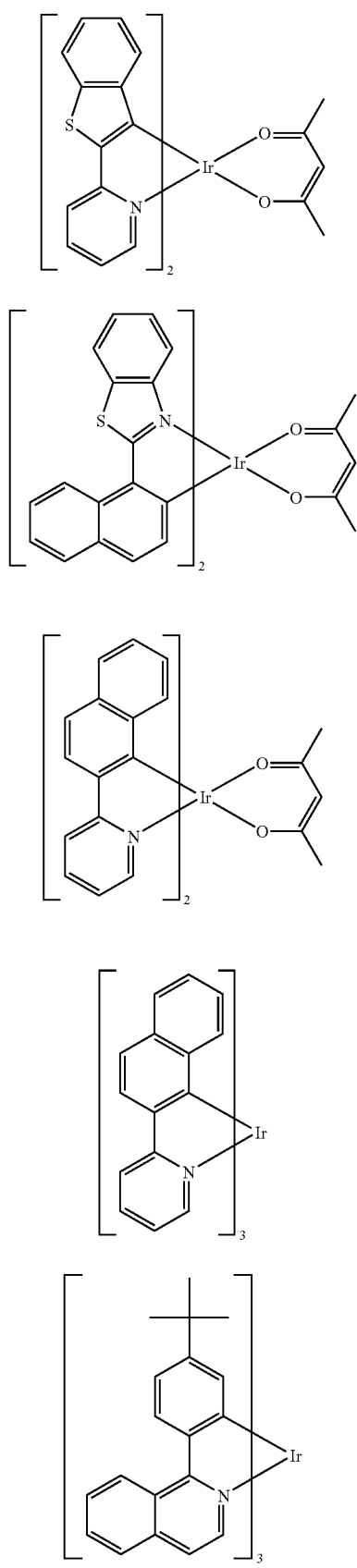
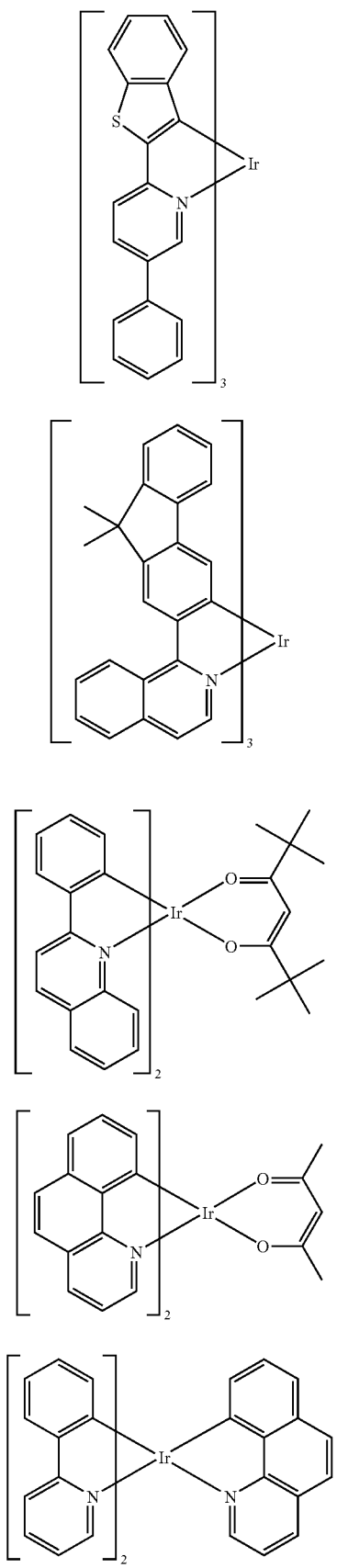

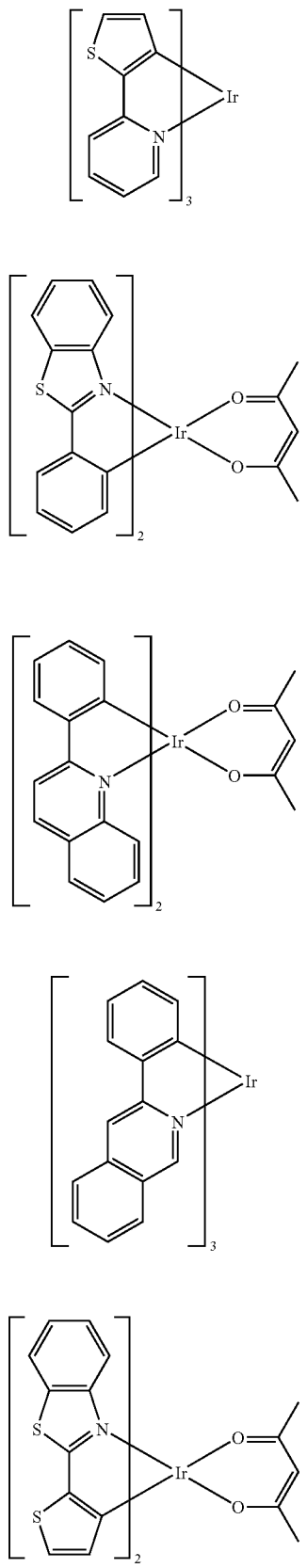
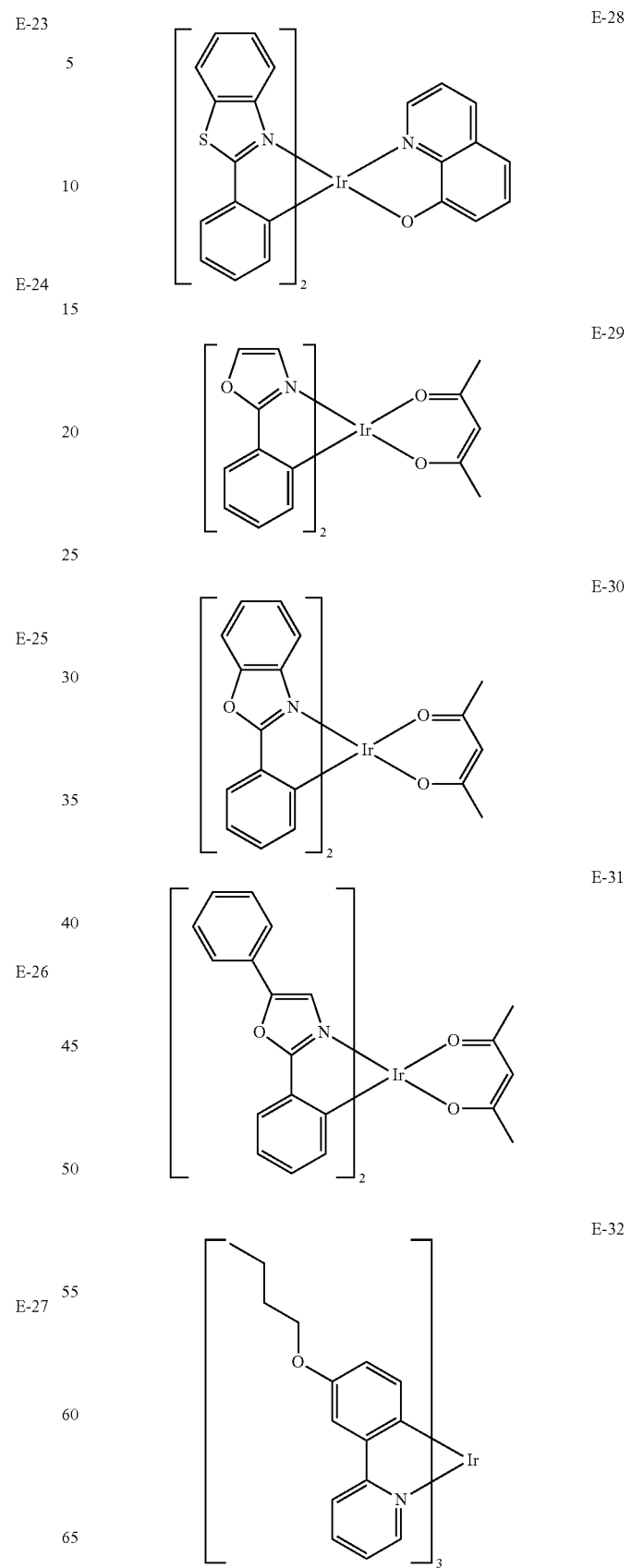

E-33 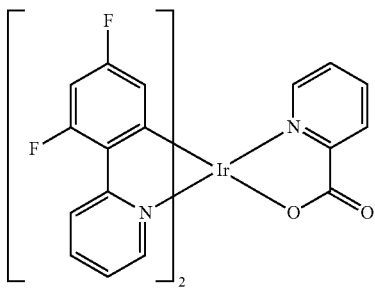

E-34 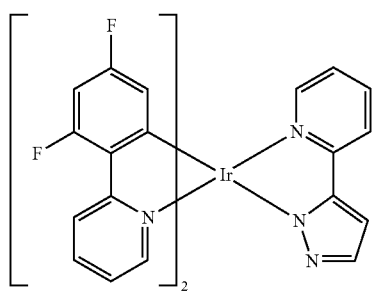

E-35 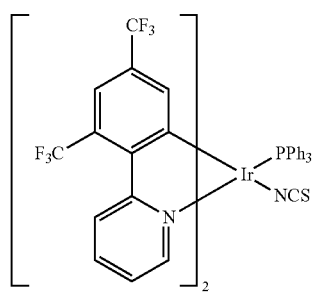

E-36 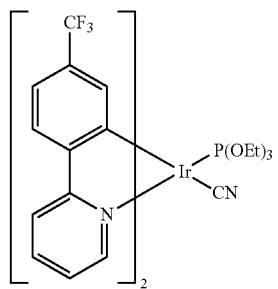

E-37 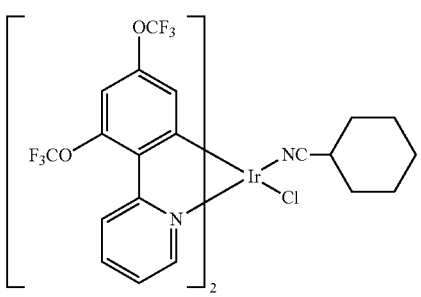

E-38 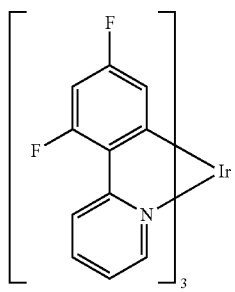

E-39 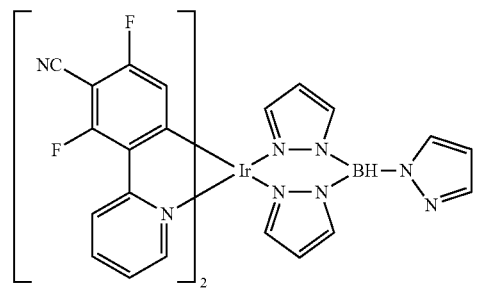

The above light-emitting compounds may be used singly or may be used in combination of two or more kinds.

The polymer compound (1') is obtained by polymerizing a hole transport polymerizable compound. The hole transport polymerizable compound has the same meaning as that of the hole transport polymerizable compound for use in the embodiment 3, and a preferred range and the reason are the same as those in the embodiment 3.

Although the preparation of the polymer compound (1') may be carried out by any of radical polymerization, cationic polymerization, anionic polymerization and addition polymerization using the aforesaid polymerizable compound, it is preferable to carry out the preparation by radical polymerization.

The weight-average molecular weight of the polymer compound (1') is desired to be in the range of usually 1,000 to 2,000,000, preferably 5,000 to 500,000. When the weight-average molecular weight is in this range, the polymer compound (1') is soluble in organic solvents and a uniform thin film is obtained, so that such a weight-average molecular weight is preferable. The weight-average molecular weight is a value measured by gel permeation chromatography (GPC) at 40° C. using tetrahydrofuran as a solvent. The solubility of the polymer compound (1') in organic solvents is the same as that in the embodiment 1.

In the production of the organic light-emitting element constituted by arranging one light-emitting layer containing the polymer compound (1), the light-emitting compound and the polymer compound (1') between an anode and a cathode, the light-emitting layer is formed on an anode provided on a substrate usually in the following manner. First, a solution in which the polymer compound (1), the light-emitting compound and the polymer compound (1') have been dissolved is prepared. The solvent used for preparing the solution is not specifically restricted, but for example, chlorine-based solvents, such as chloroform, methylene chloride and dichloroethane, ether-based solvents, such as tetrahydrofuran and anisole, aromatic hydrocarbon-based solvents, such as toluene and xylene, ketone-based solvents, such as acetone and methyl ethyl ketone, and ester-based solvents, such as ethyl acetate, butyl acetate and ethyl cellosolve acetate, are used. Subsequently, the solution thus prepared is applied onto a substrate by, for example, a wet film-forming process, such as spin coating, casting, microgravure coating, gravure coating, bar coating, roll coating, wire bar coating, dip coating, spray coating, screen printing, flexographic printing, offset printing or ink-jet printing. In the case of for example spin coating or dip coating, the solution preferably contains the light-emitting compound in an amount of 0.5 to 3 parts by weight, the polymer compound (1') in an amount of 10 to 200 parts by weight and the solvent in an amount of 1000 to 20000 parts by weight based on 100 parts by weight of the polymer compound (1) though the amounts of them depend upon the compounds used, the film-forming conditions, etc.

By providing a cathode on the light-emitting layer thus formed, an organic light-emitting element of the embodiment 4 is obtained.

As the substrate for use in the embodiment 4, an insulating substrate transparent to the emission wavelength of the above light-emitting material is preferably used, and specifically, glass, transparent plastics such as PET (polyethylene terephthalate) and polycarbonate, etc. are used.

As the anode materials for use in the embodiment 4, publicly known transparent conductive materials, e.g., ITO (indium tin oxide), tin oxide, zinc oxide, and conductive polymers, such as polythiophene, polypyrrole and polyaniline, are preferably used. The surface resistance of the electrode formed by the transparent conductive material is preferably in the range of 1 to 50 $\Omega/\square$ (ohm/square). The thickness of the anode is preferably in the range of 50 to 300 nm.

As the cathode materials for use in the embodiment 4, publicly known cathode materials, e.g., alkali metals, such as Li, Na, K and Cs; alkaline earth metals, such as Mg, Ca and Ba; Al; Mg—Ag alloy; and alloys of Al and an alkali metal or an alkaline earth metal, such as Al—Li and Al—Ca, are preferably used. The thickness of the cathode is desired to be in the range of preferably 10 nm to 1 µm, more preferably 50 to 500 nm. In the case where a metal having high activity, such as an alkali metal or an alkaline earth metal, is used, the thickness of the cathode is desired to be in the range of preferably 0.1 to 100 nm, more preferably 0.5 to 50 nm. In this case, a metal layer stable to the atmosphere is laminated on this cathode in order to protect the cathode metal. The metal to form the metal layer is, for example, Al, Ag, Au, Pt, Cu, Ni or Cr. The thickness of the metal layer is desired to be in the range of preferably 10 nm to 1 µm, more preferably 50 to 500 nm.

As the film-forming method using the above anode material, electron beam deposition, sputtering, chemical reaction, coating or the like is used, and as the film-forming method using the cathode material, resistance heating deposition, electron beam deposition, sputtering, ion plating or the like is used.

Embodiment 5

In the organic light-emitting element (embodiment 5) of the invention, one light-emitting layer containing the specific polymer compound (2) and a polymer compound (1') is arranged between an anode and a cathode. In this case, the light-emitting layer desirably contains the polymer compound (1') in an amount of preferably 10 to 200 parts by weight, more preferably 50 to 150 parts by weight, based on 100 parts by weight of the polymer compound (2). When the light-emitting layer is formed from the polymer compound (1) having both of electron transport property and light emission property and the hole transport polymer compound (1') as above, an organic light-emitting element having high luminous efficiency can be prepared even if a layer of another organic material is not provided.

The polymer compound (1') has the same meaning as that of the polymer compound (1') for use in the embodiment 4, and a preferred range and the reason are the same as those in the embodiment 4.

The light-emitting layer is formed on an anode provided on a substrate usually in the following manner. First, a solution in which the polymer compound (2) and the hole transport compound have been dissolved is prepared. The solvent used for preparing the solution is the same as that in the embodiment 4. The film-forming method using the solution prepared is the same as that in the embodiment 4. In the case of for example spin coating or dip coating, the solution preferably contains the polymer compound (1') in an amount of 10 to 200 parts by weight and the solvent in an amount of 1000 to 20000 parts by weight based on 100 parts by weight of the polymer compound (2) though the amounts of them depend upon the compounds used, the film-forming conditions, etc.

By providing a cathode on the light-emitting layer thus formed, an organic light-emitting element of the embodiment 5 is obtained.

The substrate, the anode material, the cathode material and the film-forming methods using the anode material and the cathode material for use in the embodiment 5 are the same as those in the embodiment 4.

Embodiment 6

In the organic light-emitting element (embodiment 6) of the invention, one light-emitting layer containing the specific polymer compound (3) is arranged between an anode and a cathode. When the light-emitting layer is formed by using the polymer compound (3) having all of electron transport property, phosphorescent property and hole transport property, an organic light-emitting element having high luminous efficiency can be prepared even if a layer of another organic material is not provided. In the embodiment 6, the light-emitting layer can be constituted of only the polymer compound (3), so that this embodiment also has an advantage that the production process can be more simplified.

The light-emitting layer is formed on an anode provided on a substrate usually in the following manner. First, a solution in which the polymer compound (3) has been dissolved is prepared. The solvent used for preparing the solution is the same as that in the embodiment 4. The film-forming method using the solution prepared is the same as that in the embodiment 4. In the case of for example spin coating or dip coating, the solution preferably contains the solvent in an amount of 1000 to 20000 parts by weight based on 100 parts by weight of the polymer compound (3) though the amount depend upon the compound used, the film-forming conditions, etc.

By providing a cathode on the light-emitting layer thus formed, an organic light-emitting element of the embodiment 6 is obtained.

The substrate, the anode material, the cathode material and the film-forming methods using the anode material and the cathode material for use in the embodiment 6 are the same as those in the embodiment 4.

Embodiment 7

The organic light-emitting element according to the invention may be an organic light-emitting element (embodiment 7) constituted by arranging the light-emitting layer described in the embodiments 4 to 6 and other organic layers between an anode and a cathode.

Examples of the other organic layers include a hole transport layer, an electron transport layer, a hole block layer and a buffer layer. By providing these layers, the luminous efficiency can be further enhanced.

One example of the constitution of the organic light-emitting element (embodiment 7) according to the invention is shown in FIG. 1. In FIG. 1, between an anode (2) provided on a transparent substrate (1) and a cathode (6), a hole transport layer (3), the light-emitting layer (4) described in the embodiment 1 or 2, and an electron transport layer (5) are provided in this order.

In the embodiment 7, between the anode (2) and the cathode (6) may be provided for example any one of [1] a hole transport layer/the above light-emitting layer and [2] the above light-emitting layer/an electron transport layer.

The above organic layers may be each formed by mixing a polymer material as a binder. Examples of the polymer materials include polymethyl methacrylate, polycarbonate, polyester, polysulfone and polyphenylene oxide.

A hole transport compound and an electron transport compound for use in the above hole transport layer and electron transport layer may be each used singly to form respective layers, or may be each mixed with a material having a different function to form respective layers.

Examples of the hole transport compounds to form the hole transport layer include TPD (N,N'-dimethyl-N,N'-(3-methylphenyl)-1,1'-biphenyl-4,4'-diamine); α-NPD (4,4'-bis[N-(1-naphthyl)-N-phenylamino]biphenyl); a low-molecular triphenylamine derivative, such as m-MTDATA (4,4',4"-tris(3-methylphenylphenylamino)triphenylamine); polyvinylcarbazole; a polymer compound obtained by introducing a polymerizable functional group into the above triphenylamine derivative and polymerizing them; and fluorescent polymer compounds, such as polyparaphenylene vinylene and polydialkylfluorene. An example of the above polymer compound is a polymer compound having a triphenylamine skeleton disclosed in Japanese Patent Laid-Open Publication No. 157575/1996. The above hole transport compounds may be used singly or as a mixture of two or more kinds, or different hole transport compounds may be laminated upon each other. The thickness of the hole transport layer is desired to be in the range of preferably 1 nm to 5 μm, more preferably 5 nm to 1 μm, particularly preferably 10 nm to 500 nm, though it depends upon electrical conductivity of the hole transport layer, etc.

Examples of the electron transport compounds to form the electron transport layer include low-molecular compounds, specifically, quinolinol derivative metal complex such as Alq3 (aluminum trisquinolinolate), oxadiazole derivative, triazole derivative, imidazole derivative, triazine derivative and triarylborane derivative; and polymer compounds obtained by introducing a polymerizable substituent into the above low-molecular compounds and polymerizing them. An example of the polymer compound is poly-PBD disclosed in Japanese Patent Laid-Open Publication No. 1665/1998. The above electron transport compounds may be used singly or as a mixture of two or more kinds, or different electron transport compounds may be laminated upon each other. The thickness of the electron transport layer is desired to be in the range of preferably 1 nm to 5 μm, more preferably 5 nm to 1 μm, particularly preferably 10 nm to 500 nm, though it depends upon electrical conductivity of the electron transport layer, etc.

For the purpose of inhibiting passing of holes through the light-emitting layer and thereby efficiently recombining holes with electrons in the light-emitting layer, a hole block layer may be provided adjacently to the cathode side of the light-emitting layer. For the formation of the hole block layer, publicly known materials, such as triazole derivative, oxadiazole derivative and phenanthroline derivative, are used.

Between the anode and the hole transport layer or between the anode and the organic layer laminated adjacently to the anode, a buffer layer may be further provided in order to lower injection barrier in the hole injection. For forming the buffer layer, publicly known materials, such as copper phthalocyanine and a mixture of polyethylene dioxythiophene and polystyrenesulfonic acid (PEDOT:PSS), are used.

Between the cathode and the electron transport layer or between the cathode and the organic layer laminated adjacently to the cathode, an insulating layer having a thickness of 0.1 to 10 nm may be further provided in order to enhance electron injection efficiency. For forming the insulating layer, publicly known materials, such as lithium fluoride, sodium fluoride, magnesium fluoride, magnesium oxide and alumina, are used.

As methods for forming the hole transport layer and the electron transport layer, not only dry film-forming methods, such as resistance heating deposition, electron beam deposition and sputtering, but also wet film-forming methods, such as spin coating, casting, microgravure coating, gravure coating, bar coating, roll coating, wire bar coating, dip coating, spray coating, screen printing, flexographic printing, offset printing and ink-jet printing, can be used. In the case of a low-molecular compound, a dry film-forming method is preferably used, and in the case of a polymer compound, a wet film-forming method is preferably used.

Usage

The organic light-emitting element according to the invention is preferably used as a pixel by matrix system or segment system in an image display in a publicly known manner. Moreover, the organic light-emitting element is preferably used also as a surface-emitting light source without forming a pixel.

The organic light-emitting element according to the invention is preferably used for, specifically, display, backlight, electrophotograph, illuminating light source, recording light source, exposure light source, reading light source, marker, advertising display, interior goods, optical communication, etc.

The present invention is further described with reference to the following examples, but it should be construed that the invention is in no way limited to those examples.

Examples

Synthesis Example 1

Synthesis of 2-(4-vinylbiphenyl)-4,6-bis(4-tert-butylphenyl)-1,3,5-triazine (vinyl monomer (1) of triazine derivative)

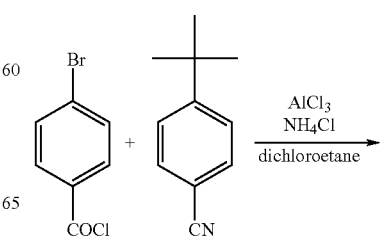

-continued

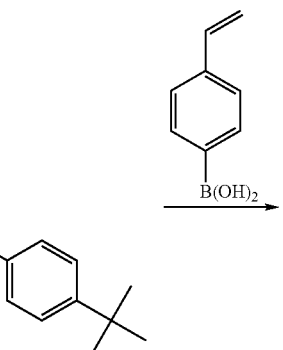
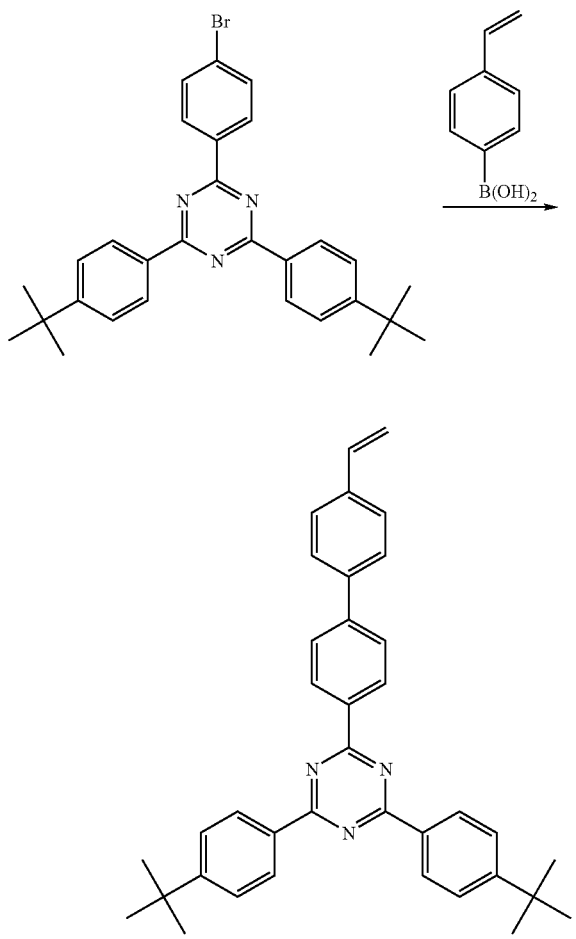

In 50 ml of dichloroethane, 10 mmol of 4-bromobenzoyl chloride and 30 mmol of 4-tert-butylbenzonitrile were dissolved, and 10 mmol of aluminum chloride and 40 mmol of ammonium chloride were added, followed by refluxing by heating for 24 hours. After the resulting solution was cooled down to room temperature, the solution was poured into 10% hydrochloric acid, and they were stirred for 1 hour. Then, extraction was carried out using chloroform, and purification was carried out by column chromatography to obtain a halogenated triazine derivative.

In a 100 ml egg plant type flask, 3 mmol of the resulting halogenated triazine derivative, 3.3 mmol of vinylphenylboric acid and 1.5 mmol of tetrabutyl ammonium bromide were placed, and 45 ml of toluene and 30 ml of a 2M potassium carbonate aqueous solution were further added. A small amount of a polymerization inhibitor was added, and 0.15 mmol of tetrakis(triphenylphosphine)palladium was added, followed by refluxing by heating for 3 hours. After the resulting solution was cooled down to room temperature, extraction was carried out using ethyl acetate, and column chromatography and recrystallization operation were carried out to obtain a white vinyl monomer (1) of a triazine derivative (1.36 g, yield: 26%).

Synthesis Example 2

Synthesis of 2-(4-vinylbiphenyl)-4,6-bis(4-methoxyphenyl)-1,3,5-triazine (vinyl monomer (2) of triazine derivative)

A white powder vinyl monomer (2) of a triazine derivative (1.26 g, yield: 27%) was obtained in the same manner as in Synthesis Example 1, except that 4-tert-butylbenzonitrile was replaced with 4-anisonitrile.

Synthesis Example 3

Synthesis of 2-(4-vinylbiphenyl)-4,6-diphenyl-1,3,5-triazine (vinyl monomer (3) of triazine derivative)

A white powder vinyl monomer (3) of a triazine derivative (1.22 g, yield: 30%) was obtained in the same manner as in Synthesis Example 1, except that 4-tert-butylbenzonitrile was replaced with benzonitrile.

Synthesis Example 4

Synthesis of 2-(4-vinylbiphenyl)-4,6-bis(biphenyl)-1,3,5-triazine (vinyl monomer (4) of triazine derivative)

A white powder vinyl monomer (4) of a triazine derivative (1.86 g, yield: 33%) was obtained in the same manner as in Synthesis Example 1, except that 4-tert-butylbenzonitrile was replaced with 4-cyanobiphenyl.

Synthesis Example 5

Synthesis of 2-(4-vinylbiphenyl)-4,6-bis(4-tert-butylbiphenyl)-1,3,5-triazine (vinyl monomer (5) of triazine derivative)

Using Suzuki coupling method, 4-tert-butylphenylboric acid and 4-bromobenzonitrile were coupled to synthesize 4-tert-butyl-4'-cyanobiphenyl.
A white powder vinyl monomer (5) of a triazine derivative (1.91 g, yield: 28%) was obtained in the same manner as in Synthesis Example 1, except that 4-tert-butylbenzonitrile used in Synthesis Example 1 was replaced with 4-tert-butyl-4'-cyanobiphenyl.

Synthesis Example 6

Synthesis of 2-(4-vinylbiphenyl)-4,6-bis(4-methoxybiphenyl)-1,3,5-triazine (vinyl monomer (6) of triazine derivative)

Using Suzuki coupling method, 4-methoxyphenylboric acid and 4-bromobenzonitrile were coupled to synthesize 4-methoxy-4'-cyanobiphenyl.
A white powder vinyl monomer (6) of a triazine derivative (1.87 g, yield: 30%) was obtained in the same manner as in Synthesis Example 1, except that 4-tert-butylbenzonitrile was replaced with 4-methoxy-4'-cyanobiphenyl.

Synthesis Example 7

Synthesis of 2-(4-vinylbiphenyl)-4,6-bis(terphenyl)-1,3,5-triazine (vinyl monomer (7) of triazine derivative)

Using Suzuki coupling method, biphenylboric acid and 4-bromobenzonitrile were coupled to synthesize 4-cyanoterphenyl.

A white powder vinyl monomer (7) of a triazine derivative (1.65 g, yield: 23%) was obtained in the same manner as in Synthesis Example 1, except that 4-tert-butylbenzonitrile was replaced with 4-cyano-terphenyl.

Synthesis Example 8

Synthesis of 2-(4-vinylbiphenyl)-4,6-bis(4-tert-butyl-p-terphenyl)-1,3,5-triazine (vinyl monomer (8) of triazine derivative)

Using Suzuki coupling method, 4-tert-butylphenylboric acid and 4-bromoiodobenzene were coupled, and then 4-cyanophenylboric acid was allowed to react with the resulting product to synthesize 4-cyano-4''-tert-butyl-p-terphenyl.

A white powder vinyl monomer (8) of a triazine derivative (1.73 g, yield: 21%) was obtained in the same manner as in Synthesis Example 1, except that 4-tert-butylbenzonitrile was replaced with 4-cyano-4''-tert-butyl-p-terphenyl.

Synthesis Example 9

Synthesis of 2-(4-vinylbiphenyl)-4,6-bis(4-methoxy-p-terphenyl)-1,3,5-triazine (vinyl monomer (9) of triazine derivative)

Using Suzuki coupling method, 4-methoxyphenylboric acid and 4-bromoiodobenzene were coupled, and then 4-cyanophenylboric acid was allowed to react with the resulting product to synthesize 4-cyano-4''-methoxy-p-terphenyl.

A white powder vinyl monomer (9) of a triazine derivative (1.86 g, yield: 24%) was obtained in the same manner as in Synthesis Example 1, except that 4-tert-butylbenzonitrile was replaced with 4-cyano-4''-methoxy-p-terphenyl.

Synthesis Example 1

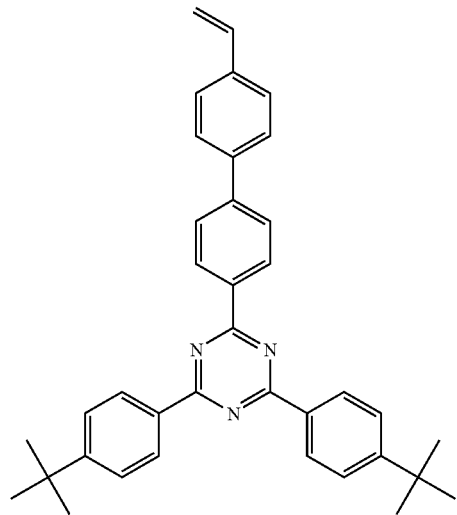

Synthesis Example 2

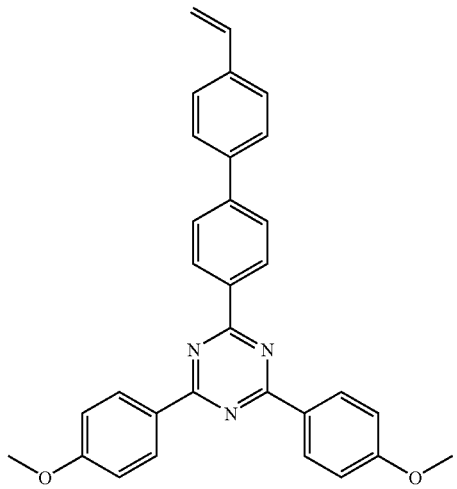

Synthesis Example 3

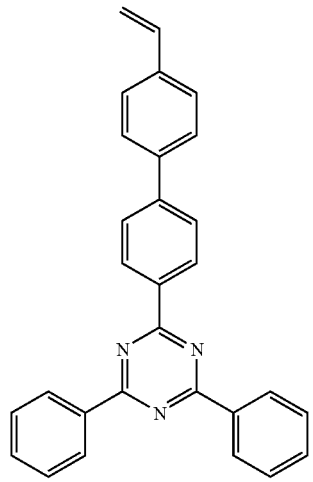

Synthesis Example 4

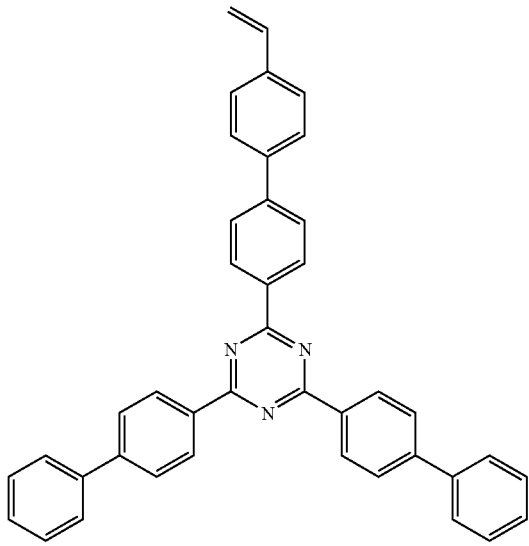

Synthesis Example 5
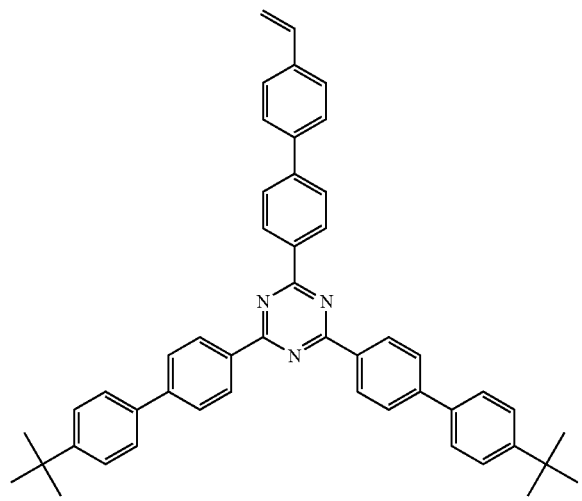
Synthesis Example 6
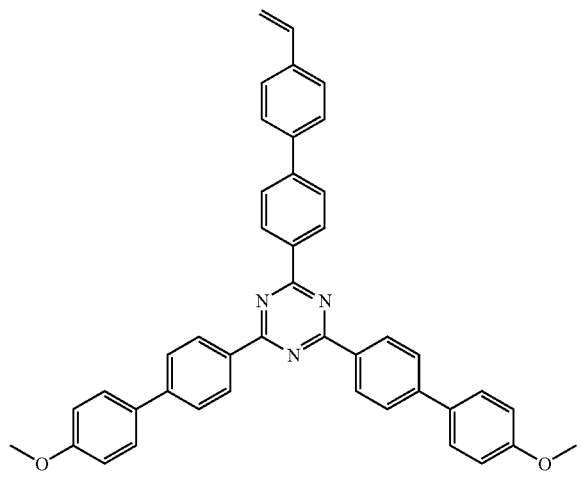
Synthesis Example 7
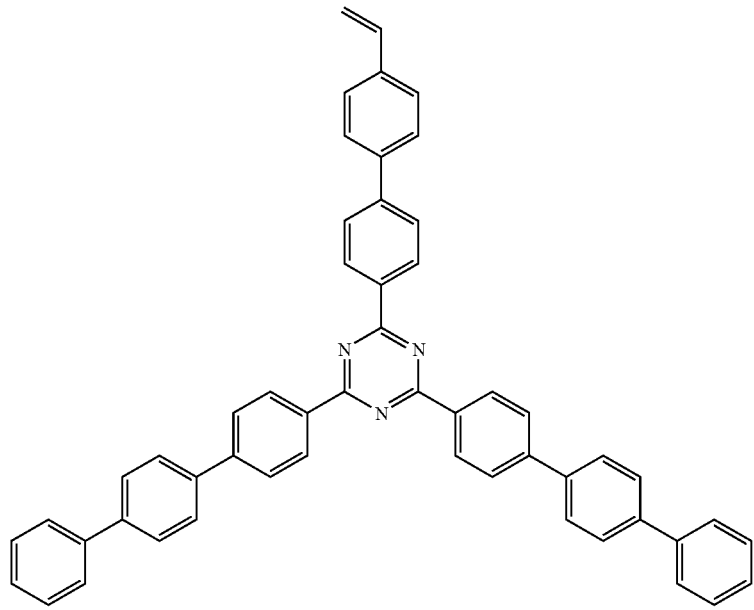

Synthesis Example 8

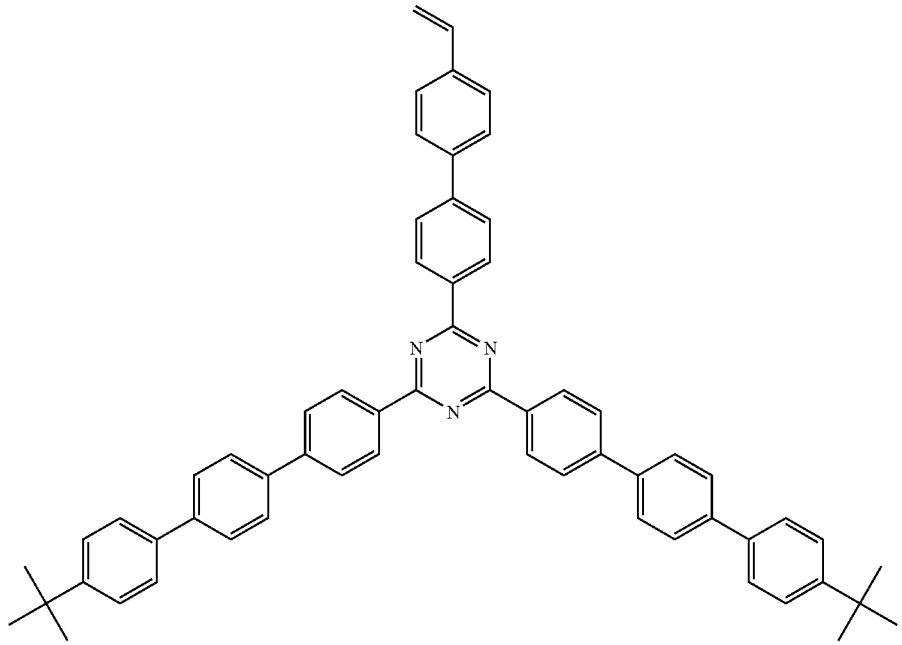

Synthesis Example 9

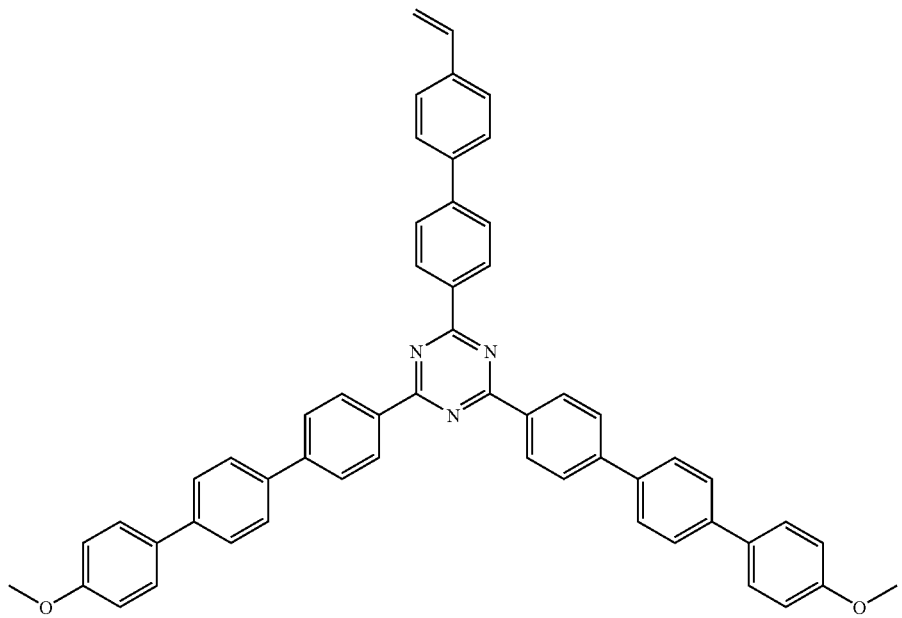

Example 1-1-1

Synthesis of Polymer Compound (1-1)

In a closed container, 200 mg of the compound synthesized in Synthesis Example 1 was placed, and 2.4 ml of dehydrated toluene was further added. Subsequently, a toluene solution (0.1 M, 39 μl) of V-601 (available from Wako Pure Chemical Industries, Ltd.) was added, followed by five cycles of freezing and degassing. The container was closed up tight under vacuum, and the solution was stirred at 60° C. for 60 hours. After the reaction, the reaction solution was dropwise added to 100 ml of acetone to obtain a precipitate. Then, reprecipitation operation with toluene-acetone was further repeated twice, and thereafter, the precipitate was vacuum dried for one night at 50° C. to obtain a polymer compound (1-1). The polymer compound (1-1) had a weight-average molecular weight (Mw) of 137,000 and a molecular weight distribution index (Mw/Mn) of 2.10 (Table 1).

Examples 1-1-2 to 1-1-9

Syntheses of Polymer Compounds (1-2) to (1-9)

Polymer compounds (1-2) to (1-9) were synthesized in the same manner as in Example 1-1-1, except that the compounds synthesized in Syntheses Examples 2 to 9 were each used instead of the compound synthesized in Synthesis Example 1.

Weight-average molecular weights (Mw) of the resulting polymer compounds, etc. are set forth in Table 1.

Example 1-2-1

Element Using Polymer Compound (1-1)

In the first place, a polymer compound (4) was synthesized in the following manner. In a closed container, 95 mg of the hole transport polymerizable compound (8-7) was placed, and 2.2 ml of dehydrated toluene was further added. Subsequently, a toluene solution (0.1 M, 43 µl) of V-601 (available from Wako Pure Chemical Industries, Ltd.) was added, followed by five cycles of freezing and degassing. The container was closed up tight under vacuum, and the solution was stirred at 60° C. for 60 hours. After the reaction, the reaction solution was dropwise added to 100 ml of acetone to obtain a precipitate. Then, reprecipitation operation with toluene-acetone was further repeated twice, and thereafter, the precipitate was vacuum dried for one night at 50° C. to obtain a polymer compound (4).

Then, a substrate with ITO (available from Nippo Electric Co, Ltd.) was used. This substrate was a substrate in which two ITO (indium tin oxide) electrodes (anodes) each having a width of 4 mm had been formed in the form of stripes on one surface of a glass substrate of 25 mm square.

Next, onto the substrate with ITO, poly(3,4-ethylenedioxythiophene).polystyrenesulfonic acid (available from Bayer Co., Ltd., trade name: Baytron P) was applied by spin coating under the conditions of a revolution number of 3500 rpm and a coating time of 40 seconds. Thereafter, the coating layer was dried by a vacuum dryer at 60° C. for 2 hours under reduced pressure to form an anode buffer layer. The thickness of the resulting anode buffer layer was about 50 nm. Next, 40.5 mg of the polymer compound (1-1), 9 mg of the phosphorescent compound (E-2) and 40.5 mg of the polymer compound (4) were dissolved in 2910 mg of toluene, and this solution was filtered through a filter having a pore diameter of 0.2 µm to prepare a coating solution. Subsequently, onto the anode buffer layer, the coating solution was applied by spin coating under the conditions of a revolution number of 3000 rpm and a coating time of 30 seconds. After the application, the coating layer was dried at room temperature (25° C.) for 30 minutes to form a light-emitting layer. The thickness of the resulting light-emitting layer was about 100 nm.

Next, the substrate having the light-emitting layer thus formed was placed in a deposition apparatus. Then, barium and aluminum were co-deposited in a weight ratio of 1:10 to form two cathodes each having a width of 3 mm in the form of stripes so that the cathodes should be at right angles to the extending directions of the anodes. The film thickness of the resulting cathode was above 50 nm.

In the last place, a lead wire (wiring) was connected to the anode and the cathode in an argon atmosphere to prepare four organic EL elements of 4 mm (length)×3 mm (width). To the organic EL elements, a voltage was applied by the use of programmable direct voltage/current source (TR6143, manufactured by Advantest Corporation) to allow the elements to undergo light emission.

The light emission luminance was measured by the use of a luminance meter (BM-8, manufactured by Topcon Corporation). Maximum external quantum efficiency, maximum attainable brightness and driving voltage of the organic light-emitting elements prepared and luminance half life measured when the organic light-emitting elements were lighted up at an initial luminance of 100 cd/m² and subjected to constant-current driving are set forth in Table 2.

Examples 1-2-2 to 1-2-9

Elements Using Polymer Compounds (1-2) to (1-9)

Elements using the polymer compounds (1-2) to (1-9) were prepared in the same manner as in Example 1-2-1, except that the polymer compounds (1-2) to (1-9) were each used instead of the polymer compound (1-1).

Maximum external quantum efficiency, maximum attainable brightness and driving voltage of the organic light-emitting elements prepared and luminance half life measured when the organic light-emitting elements were lighted up at an initial luminance of 100 cd/m² and subjected to constant-current driving are set forth in Table 2.

Example 2-1

Synthesis of Polymer Compound (2)

In a closed container, 160 mg of the compound synthesized in

Synthesis Example 1 and 40 mg of a compound (F) were placed, and 2.4 ml of dehydrated toluene was further added. Subsequently, a toluene solution (0.1 M, 39 µl) of V-601 (available from Wako Pure Chemical Industries, Ltd.) was added, followed by five cycles of freezing and degassing. The container was closed up tight under vacuum, and the solution was stirred at 60° C. for 60 hours. After the reaction, the reaction solution was dropwise added to 100 ml of acetone to obtain a precipitate. Then, reprecipitation operation with toluene-acetone was further repeated twice, and thereafter, the precipitate was vacuum dried for one night at 50° C. to obtain a polymer compound (2). The polymer compound (2) had a weight-average molecular weight (Mw) of 82,000 and a molecular weight distribution index (Mw/Mn) of 1.52. The m/(m+n) value of the polymer compound estimated from the results of ICP elemental analysis and $^{13}$C-NMR measurement was 0.16.

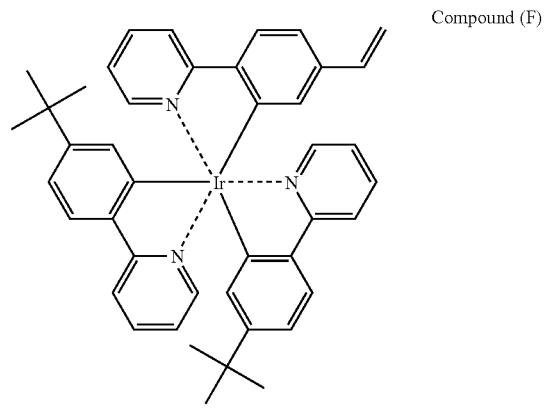

Compound (F)

Example 2-2

Element Using Polymer Compound (2)

Organic light-emitting elements were prepared in the same manner as in Example 1-2-1, except that a coating solution for use in the formation of a light-emitting layer was prepared using 45 mg of the polymer compound (2), 45 mg of the polymer compound (4) and 2910 mg of toluene instead of 40.5 mg of the polymer compound (1-1), 9 mg of the phosphorescent compound (E-2), 40.5 mg of the polymer compound (4) and 2910 mg of toluene. Maximum external quantum efficiency, maximum attainable brightness and driving voltage of the organic light-emitting elements prepared and luminance half life measured when the organic light-emitting elements were lighted up at an initial luminance of 100 cd/m$^2$ and subjected to constant-current driving are set forth in Table 2.

Example 3-1

Synthesis of Polymer Compound (3)

In a closed container, 95 mg of the compound synthesized in Synthesis Example 1, 10 mg of the compound (F) and 95 mg of the hole transport polymerizable compound (8-7) were placed, and 2.4 ml of dehydrated toluene was further added. Subsequently, a toluene solution (0.1 M, 39 µl) of V-601 (available from Wako Pure Chemical Industries, Ltd.) was added, followed by five cycles of freezing and degassing. The container was closed up tight under vacuum, and the solution was stirred at 60° C. for 60 hours. After the reaction, the reaction solution was dropwise added to 100 ml of acetone to obtain a precipitate. Then, reprecipitation operation with toluene-acetone was further repeated twice, and thereafter, the precipitate was vacuum dried for one night at 50° C. to obtain a polymer compound (3). The polymer compound (3) had a weight-average molecular weight (Mw) of 97,000 and a molecular weight distribution index (Mw/Mn) of 1.60. The m/(m+n) value, the x/n value and the y/n value of the polymer compound estimated from the results of ICP elemental analysis and $^{13}$C-NMR measurement were 0.09, 0.49 and 0.51, respectively.

Example 3-2

Element Using Polymer Compound (3)

Organic light-emitting elements were prepared in the same manner as in Example 1-2-1, except that a coating solution for use in the formation of a light-emitting layer was prepared using 90 mg of the polymer compound (3) and 2910 mg of toluene instead of 40.5 mg of the polymer compound (1-1), 9 mg of the phosphorescent compound (E-2), 40.5 mg of the polymer compound (4) and 2910 mg of toluene. Maximum external quantum efficiency, maximum attainable brightness and driving voltage of the organic light-emitting elements prepared and luminance half life measured when the organic light-emitting elements were lighted up at an initial luminance of 100 cd/m$^2$ and subjected to constant-current driving are set forth in Table 2.

TABLE 1

| Example | Polymer compound | Weight-average molecular weight (Mw) | Molecular weight distribution index (Mw/Mn) | Yield (%) |
|---|---|---|---|---|
| 1-1-1 | 1-1 | 137,000 | 2.10 | 80.0 |
| 1-1-2 | 1-2 | 80,000 | 2.39 | 66.6 |
| 1-1-3 | 1-3 | 91,000 | 1.49 | 66.0 |
| 1-1-4 | 1-4 | 85,000 | 1.83 | 92.4 |
| 1-1-5 | 1-5 | 107,000 | 1.76 | 89.8 |
| 1-1-6 | 1-6 | 78,000 | 2.39 | 84.2 |
| 1-1-7 | 1-7 | 87,000 | 2.10 | 88.5 |
| 1-1-8 | 1-8 | 71,000 | 2.00 | 75.2 |
| 1-1-9 | 1-9 | 98,000 | 2.01 | 77.3 |
| 2-1 | 2 | 82,000 | 1.52 | 69.8 |
| 3-1 | 3 | 97,000 | 1.60 | 68.2 |

TABLE 2

| Example | Polymer compound | Low-molecular compound | Maximum external quantum efficiency (%) | Maximum attainable brightness (cd/m$^2$) | Driving voltage (v) | Brightness half life (h) |
|---|---|---|---|---|---|---|
| 1-2-1 | 1-1, 4 | E-2 | 9.1 | 58,000 | 2.5 | 5200 |
| 1-2-2 | 1-2, 4 | E-2 | 8.9 | 55,000 | 2.7 | 3600 |
| 1-2-3 | 1-3, 4 | E-2 | 8.7 | 51,000 | 2.6 | 3300 |
| 1-2-4 | 1-4, 4 | E-2 | 7.5 | 40,000 | 2.4 | 3500 |
| 1-2-5 | 1-5, 4 | E-2 | 7.8 | 44,000 | 2.2 | 4500 |
| 1-2-6 | 1-6, 4 | E-2 | 7.8 | 43,000 | 2.3 | 3700 |
| 1-2-7 | 1-7, 4 | E-2 | 6.1 | 32,000 | 2.9 | 3200 |
| 1-2-8 | 1-8, 4 | E-2 | 6.5 | 39,000 | 2.7 | 4100 |
| 1-2-9 | 1-9, 4 | E-2 | 6.4 | 37,000 | 2.8 | 3400 |
| 2-2 | 2, 4 | — | 9.3 | 62,000 | 2.1 | 7800 |
| 3-2 | 3 | — | 9.8 | 66,000 | 2.2 | 8900 |

The invention claimed is:

1. A polymer compound comprising a constitutional unit derived from an electron transport polymerizable compound represented by the formula (1):

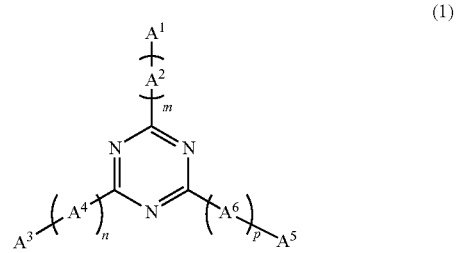

wherein $A^1$, $A^3$ and $A^5$ are each independently a monovalent aromatic group which may have a hetero atom as a ring-constituting atom, $A^2$, $A^4$ and $A^6$ are each independently a divalent aromatic group which may have a hetero atom as a ring-constituting atom, at least one of $A^1$ to $A^6$ has a substituent having a polymerizable functional group, $A^1$ to $A^6$ may have a substituent other than a substituent having a polymerizable functional group, m is an integer of 1 to 2, n is an integer of 0 to 2, and p is an integer of 0 to 2,
  wherein said polymer compound is a light-emitting polymer compound further comprising a constitutional unit derived from a light-emitting polymerizable compound, and
  wherein $A^1$ of the polymerizable compound represented by the formula (1) from which a constitutional unit of the polymer compound is derived has a substituent having a polymerizable group, and both n and p do not represent 0 at the same time.

2. The polymer compound as claimed in claim 1, wherein the light-emitting polymerizable compound has phosphorescent property.

3. The polymer compound as claimed in claim 2, wherein the light-emitting polymerizable compound is a transition metal complex containing a substituent having a polymerizable functional group.

4. The polymer compound as claimed in claim 3, wherein the transition metal complex is an iridium complex.

5. The polymer compound as claimed in claim 1, which further comprises a unit derived from a hole transport polymerizable compound.

6. An organic light-emitting element constituted by arranging a light-emitting layer between an anode and a cathode, wherein the light-emitting layer comprises the polymer compound as claimed in claim 1.

7. The polymer compound as claimed in claim 1, wherein $A^2$, $A^4$ and $A^6$ of formula (1) are each independently a phenylene group that may be substituted with a cyano group, an amino group, an alkyl group of 1 to 12 carbon atoms or an alkoxy group of 1 to 12 carbon atoms.

* * * * *